United States Patent
Sakaki

(10) Patent No.: US 7,027,043 B2
(45) Date of Patent: Apr. 11, 2006

(54) WIRING SUBSTRATE CONNECTED STRUCTURE, AND DISPLAY DEVICE

(75) Inventor: Yoichiro Sakaki, Tsu (JP)

(73) Assignee: Sharp Kabushiki Kaisha, Osaka (JP)

( * ) Notice: Subject to any disclaimer, the term of this patent is extended or adjusted under 35 U.S.C. 154(b) by 416 days.

(21) Appl. No.: 10/364,340

(22) Filed: Feb. 12, 2003

(65) Prior Publication Data

US 2003/0179158 A1 Sep. 25, 2003

(30) Foreign Application Priority Data

Mar. 25, 2002 (JP) .............................. 2002-084270
Nov. 22, 2002 (JP) .............................. 2002-340076

(51) Int. Cl.
*G09G 5/00* (2006.01)

(52) U.S. Cl. .......................... 345/206; 345/87; 349/54; 349/152

(58) Field of Classification Search ........ 345/204–206, 345/55, 93, 87; 349/54–55, 192, 152, 149
See application file for complete search history.

(56) References Cited

U.S. PATENT DOCUMENTS

| | | | | |
|---|---|---|---|---|
| 4,688,896 A | * | 8/1987 | Castleberry | 349/55 |
| 4,807,973 A | * | 2/1989 | Kawasaki | 349/192 |
| 4,840,459 A | * | 6/1989 | Strong | 349/55 |
| 5,268,678 A | | 12/1993 | Nakazawa et al. | |
| 5,307,085 A | * | 4/1994 | Nakamura | 345/99 |
| 5,608,245 A | * | 3/1997 | Martin | 257/291 |
| 6,111,558 A | * | 8/2000 | Jeung et al. | 345/93 |
| 6,111,621 A | * | 8/2000 | Kim et al. | 349/54 |

FOREIGN PATENT DOCUMENTS

| | | | |
|---|---|---|---|
| JP | 4-217229 A | 8/1992 | |
| JP | 04-283727 | 10/1992 | |
| JP | 5-303109 A | 11/1993 | |
| JP | 06018910 A | * 1/1994 | .................. 349/54 |
| JP | 6-202132 A | 7/1994 | |
| JP | 6-222377 A | 8/1994 | |
| JP | 6-223896 A | 8/1994 | |
| JP | 6-231814 A | 8/1994 | |
| JP | 8006058 | 1/1996 | |
| JP | 8-304845 A | 11/1996 | |
| JP | 9-244045 A | 9/1997 | |
| KR | 0144283 B1 | 4/1998 | |

OTHER PUBLICATIONS

U.S. Appl. No. 09/497,671, filed Feb. 4, 2000 entitled "Liquid Crystal Display".
Korean Search Report mailed Dec. 21, 2001 in corresponding Korean application No. 10-2000-5078.

* cited by examiner

*Primary Examiner*—Dennis-Doon Chow
(74) *Attorney, Agent, or Firm*—Nixon & Vanderhye P.C.

(57) ABSTRACT

A TFT substrate having formed thereon source bus lines and a source GS substrate having formed thereon source output wirings are respectively provided with a panel side auxiliary line and a driver side auxiliary line, each being provided so as to cross the source bus lines and the source output wirings via an insulating film, and in a substrate connection part, not only the source lines and source output lines but also the panel side auxiliary line and the driver side auxiliary line formed on respective substrates. With this structure, a wiring connection inferior between the wiring substrates to be connected can be fixed with ease while suppressing generation of secondary inferior.

22 Claims, 15 Drawing Sheets

A—A

WIRING SUBSTRATE CONNECTED STRUCTURE, AND DISPLAY DEVICE

FIELD OF THE INVENTION

The present invention relates to a wiring substrate connected structure for mounting a drive circuit substrate to a display panel in a liquid crystal display device, an organic EL display device, an inorganic EL display device, or other active matrix-type display device.

BACKGROUND OF THE INVENTION

Currently, for the connection between a display panel in a liquid crystal display device or other active matrix-type display device and a driving circuit for driving the display panel, adopted are the TCP (Tape Carrier Package) system or the COG (Chip on Glass) system, the monolithic system utilizing low temperature polycrystalline silicone techniques, and the like.

In the TCP system, as illustrated in FIG. 11, with respect to a display panel 101, a plurality of gate TCPs 103, each having mounted thereon a gate IC (Integrated Circuit) 102 serving as a gate signal line driving circuit, and a plurality of source TCPs 105 each having mounted thereon a source IC 104 serving as a source signal line driving circuit are connected. Further, these gate TCPs 103 and source TCPs 105 are respectively connected to a gate PWB (Printed Wire Bonding) 106 and a source PWB 107 for inputting signals to these TCPs. Each of these PWBs is connected to an external circuit substrate via an FPC (Flexible Printed Circuit) 108.

In the COG system, as illustrated in FIG. 12, on a liquid crystal panel 111, a plurality of gate ICs 112 serving as a gate source line driving circuit and a plurality of source ICs 113 serving as a source signal line driving circuit are mounted. These gate ICs 112 and source ICs 113 are connected to a gate FPC 114 and a source FPC 115 respectively for inputting signals to be connected to an external circuit substrate via these gate FPC 114 and source FPC 115.

The foregoing TCP system and the COG system are advantageous in long-term good record for mass-production, quality and reliability, whereas disadvantageous in that high costs are required for raw materials and mounting.

In the monolithic system, the gate IC and the source IC adopted in the foregoing COG system are integrated in the display panel utilizing the low temperature polycrystalline silicone techniques. This system permits a reduction in the number of required components as compared to the cases of adopting the TCP system or the COG system, which results in cost reduction for raw materials and mounting. In this way, however, the design on the side of the display panel becomes complicated, which, in turn, increases costs. Furthermore, the monolithic system is certainly disadvantages for a large-size display panel, and thus the applicable range for the monolithic system is limited.

Other than the foregoing three systems, for example, Japanese Unexamined Patent Application No. 04-283727/1992 (Tokukaihei 04-283727, published on Oct. 8, 1992) discloses the GOG (Glass on Glass) system utilizing the same amorphous silicone for the display panel, as adopted in the TCP system or the COG system, at the same costs for raw materials or lower than the monolithic system. In the GOG system, as illustrated in FIG. 13, signals are input from a FPC 124 into a gate GS (Glass Stick) 122 and a source GS 123 having mounted thereon ICs serving as a driving circuit via on a display panel 121, thereby driving the display panel 121.

In the GOG system, the section for the driving circuit which can be a cause for a lower quality in the monolithic system is prepared in separate steps as the gate GS 122 and the source GS 123. Therefore, in the GOG system, a cost increase due to lower yield of the display panels 121 can be suppressed, and the required number of components can be reduced as compared to the TCP system or the COG system.

However, in the conventional structure, particularly in the TCP system and the GOG system, a connection inferior is liable to occur between the substrate having mounted thereon the display panel (hereinafter referred to as a display panel side substrate) and the substrate having mounted thereon an IC serving as a driving circuit (hereinafter referred to as a driving circuit side substrate), due to, for example, foreign substances being contaminated into the connected part, which would cause an opening or leakage. Furthermore, in order to correct such connection inferior, the following problems arise.

In the TCP system, in order to correct the connection inferior, first, a part of the TCP, subjected to the connection inferior between the display panel side substrate and the driving circuit side substrate, is separated. Then, after cleaning residual resin for connection remaining on the surface of the panel, a new TCP or IC is connected again. However, this correction method requires quite a few steps, and an operating efficiency would be lowered.

Furthermore, when adopting the foregoing correction method in the GOG system, as adopted in the TCP system, to fix the opening or leakage resulting from connection inferior between the substrates such as contaminations of foreign substances, other than the problem of insufficient operation efficiency, the following problem arises. Namely, although the GOG system is advantageous over other system in costs, the GOG system presents a serious problem in that an increase in percentage defective in the GOG connection resulting from contamination of foreign substances or difficulties in GS exchange in the case of generating connection inferior would be a serious problem.

Firstly, the problem of an increase in percentage defective, resulting from foreign substances contaminated in the substrate connected part in the GOG system will be explained in reference to FIGS. 14(a) through 15(b). FIG. 14(a) is a sectional view taken along an arrow A–A' of FIG. 11, and shows the state where foreign substances are contaminated between substrates to be connected. FIG. 15(a) is a sectional view taken along an arrow B–B' of FIG. 13, and shows the state where foreign substances are contaminated between substrates to be connected.

As illustrated in FIG. 14(a), for the TCP system, a terminal 109 on the part of the display panel side substrate subjected to the contamination of foreign substances 131 is separated from a terminal 110 on the driving circuit side substrate. However, as the TCP side substrate has certain flexibility, the connection between terminals adjacent to the foreign substances 131 as contaminated can be ensured. Furthermore, as illustrated in FIG. 14(b), in the case where the terminals to be connected have relatively long connection area, irrespectively of the foreign substances 131, the connection between terminals subjected to the contamination of the foreign substances 131 can be ensured in an area separated from the foreign substances 131.

In contrast, in the GOG system, as illustrated in FIG. 15(a), the substrate does not have flexibility, not only a terminal 125 of the display panel side substrate 1 and a terminal 126 on the driving circuit side substrate, which are subjected to the contamination of the foreign substance 131, but also a terminal adjacent to the terminal 125 and a terminal adjacent to the terminal 126 are liable to be open. Furthermore, as illustrated in FIG. 15(*b*), even in the case where the terminals to be connected have relatively long connection area, the connection between the terminals cannot be ensured even in an area apart from the foreign substance 131.

Furthermore, in the GOG system, the wiring on the GS glass for the driving circuit side substrate is formed in a thin film in thickness of not more than 1 µm. Therefore, electrically conductive particles (ø 5 to 10 µm) in an anisotropic conductive film serving as a connection material between the substrates are agglomerated not only at the terminals but also in a space between the terminals, and thus a leakage due to the connection between the electrically conductive particles is liable to occur. In contrast, in the TCP system, the wiring on the TCP has a thickness in a range of around from 10 to 30 µm, which is sufficiently larger with respect to the wiring thickness formed by a thin film on the GS glass. Thus, particles are less liable to be agglomerated between terminals.

Next, the problem associated with the difficulty in exchanging the driving circuit in the case of generating the connection inferior in the wiring in the connected part between the substrates will be explained. When the GOG system is applied to a device of a large size, the driving circuit side substrate becomes larger in size (for example, in the case of applying the GOG system to a 15" class module, the long side of the substrate becomes around 300 mm). Thus, such problem as the driving circuit side substrate or the display panel side substrate being cracked is liable to occur in separating the driving side substrate.

Even if there is only one connection inferior, the whole driving circuit side substrate needs to be replaced unlike the TCP system whereby each TCP is replaceable.

Incidentally, other than the foregoing correction method of a connection inferior resulting from the contamination of foreign substances, a correction method of disconnecting by applying a laser beam with respect to the foreign substances may be adopted. However, the electrically conductive foreign substances generally have a thickness of around several tens µm s, and thus it is technically difficult to separate only the foregoing substances through the glass substrate without causing any damage to the electrode terminal.

As described, in the conventional method, particularly in the GOG system, an increase in the connection inferior generation ratio, the difficulty in correcting the connection inferior, or the resulting damage of a display panel from the correction error, an increase in the number of operations, a cost increase for the materials required for the necessary correction, generation of secondary inferior which possibly occur when correcting, lower quality would be the problem.

SUMMARY OF THE INVENTION

It is an object of the present invention to provide a wiring substrate connected structure for an active matrix type display device, which permits a fixing of a wiring connection inferior between wiring substrates to be connected, with ease, as occurred, for example, in a connected part between a display panel side substrate and a driving circuit side substrate, while suppressing generation of a secondary inferior.

In order to achieve the foregoing object, a wiring substrate connection structure in accordance with the first invention for connecting two wiring substrates in such a manner that a plurality of connection wirings formed on respective wiring substrates are electrically connected in a substrate connection part, is arranged such that:

each of the wiring substrates comprises at least one auxiliary wiring formed so as to cross the plurality of connection wirings formed on each of the wiring substrates via an insulating film; and in the substrate connection part, not only the plurality of connection wirings but also the auxiliary wiring formed on one of the wiring substrates are connected respectively to the plurality of connection wirings and the auxiliary wiring formed on the other wiring substrate.

In order to achieve the above object, a wiring substrate connected structure in accordance with the second invention, for electrically connecting a plurality of connection wirings formed on one of a pair of wiring substrates and a plurality of connection wiring formed on the other of the pair of wiring substrates in a substrate connection part, is arranged such that:

each of the pair of wiring substrates comprises at least one auxiliary wiring formed so as to cross the plurality of connection wirings formed on each of the pair of wiring substrates via an insulating film; and in the substrate connection part, not only the plurality of connection wirings but also the auxiliary wiring formed one of the pair of wiring substrates are connected respectively to the plurality of connection wirings and the auxiliary wiring formed on the other of the pair of wiring substrates.

According to the foregoing wiring substrate connected structure in accordance with the first invention or the second invention, in an event of a connection inferior between the connection wirings caused by, for example, foreign substances being contaminated in the connection part of the wiring substrates, the connection inferior can be fixed by short-circuiting the connection wiring subjected to the connection inferior and the auxiliary wiring. Specifically, for example, in an event of an opening of the connection wiring in the substrate connection part, the connection wiring subjected to the opening and the auxiliary wiring are short-circuited by projecting a laser beam to an intersection between the connection wiring and the auxiliary wiring, so that a signal or a voltage can be applied to the connection wiring via the auxiliary wiring. Further, in an event of a leakage as a connection inferior, the connection wiring in a vicinity of the part subjected to leakage is cut off with an application of a laser beam, and then after separating the part subjected to leakage from the connection wiring, the connection wiring and the auxiliary wiring are short-circuited, so that a signal or a voltage can be applied to the connection wiring via the auxiliary wiring.

As a result, the connection inferior can be fixed with ease by projecting a laser beam without troublesome tasks of separating, cleaning, re-connecting the substrate for the connection of the substrate subjected to the connection inferior as required in the conventional correction method. Furthermore, an occurrence of secondary inferior such as a crack in the substrate when separating the substrate can be suppressed.

A display device in accordance with the third invention which comprises a display panel side substrate provided with a display area and a driving circuit side substrate provided with a driving circuit, in which a plurality of connection wirings formed on the display panel side substrate and a plurality of connection wirings formed on the driving circuit side substrate are electrically connected in a substrate connection part provided outside the display area, is arranged such that:

each of the display panel side substrate and the driving circuit side substrate comprises at least one auxiliary wiring formed so as to cross the plurality of connection wirings formed on each of the display panel side substrate and the driving circuit side substrate via an insulating film; and in the substrate connection part, the auxiliary wiring formed on the display panel side substrate is electrically connected to the auxiliary wiring formed on the driving circuit side substrate, to constitute a substrate connection part correction-use auxiliary wiring.

A display device in accordance with the fourth invention which comprises a display panel side substrate provided with a display area and a driving circuit side substrate provided with a driving circuit, in which a plurality of connection wirings formed on the display panel side substrate and a plurality of connection wirings formed on the driving circuit side substrate are electrically connected in a substrate connection part provided outside the display area, is arranged such that:

each of the display panel side substrate and the driving circuit side substrate comprises at least one auxiliary wiring formed so as to cross the plurality of connection wirings formed on each of the display panel side substrate and the driving circuit side substrate via an insulating film; and in the substrate connection part, the auxiliary wiring formed on the display panel side substrate is electrically connected to the auxiliary wiring formed on the driving circuit side substrate, to constitute a substrate connection part correction-use auxiliary wiring.

According to the foregoing display device in accordance with the third or fourth invention, for a liquid crystal display device or other active matrix type display device, a display panel and a driving circuit (gate driver or a source driver, etc.) can be formed on different substrates, and when forming a display device by connecting these substrates, the connection structure for connecting the connection wirings can be used for the connection between the display panel side substrate and the driving circuit side substrate.

As a result, the connection inferior can be fixed with ease by projecting a laser beam without troublesome tasks of separating, cleaning, re-connecting the substrate for the connection of the substrate subjected to the connection inferior as required in the conventional correction method. Furthermore, an occurrence of secondary inferior such as a crack in the substrate when separating the substrate can be suppressed.

For a fuller understanding of the nature and advantages of the invention, reference should be made to the ensuing detailed description taken in conjunction with the accompanying drawings.

DESCRIPTION OF THE EMBODIMENTS

The following will describe an embodiment in accordance with the present invention in reference to drawings. The present embodiment will illustrate the present invention as it is applied to a liquid crystal display device. In the liquid crystal display device, a display panel side substrate is connected to a driving circuit side substrate by GOG as an example.

Figure 1:
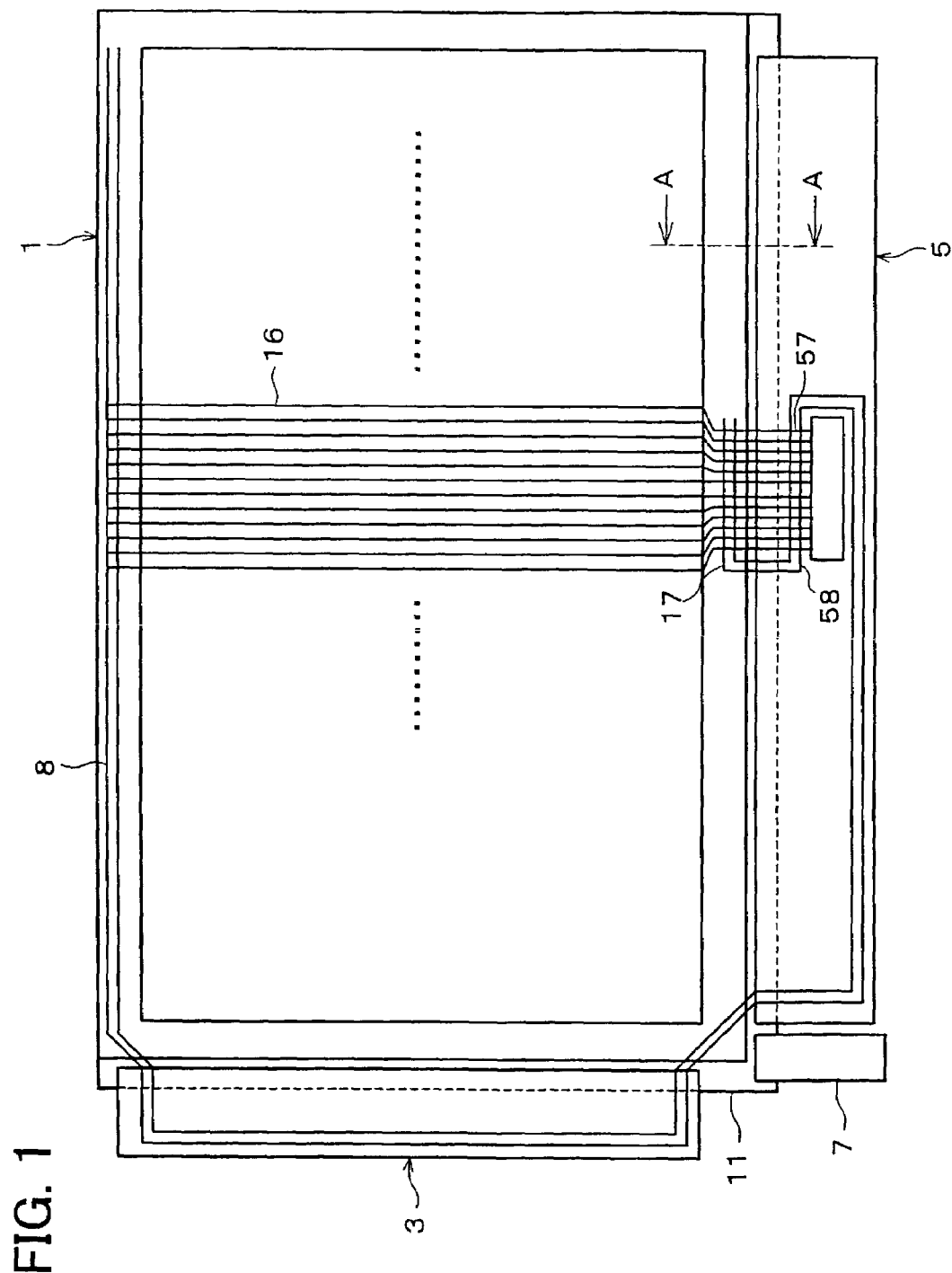
FIG. 1, illustrating an embodiment in accordance with the present invention, is a plan view showing an overall arrangement of a liquid crystal display device.

As shown in FIG. 1, the liquid crystal display device includes a liquid crystal panel formed by a display panel 1 and a gate GS substrate 3 and a source GS substrate 5 which are driving circuit side substrates. The liquid crystal panel is connected to an external circuit substrate by an FPC 7 and driven by a signal from an external circuit via the FPC 7.

Figure 2:
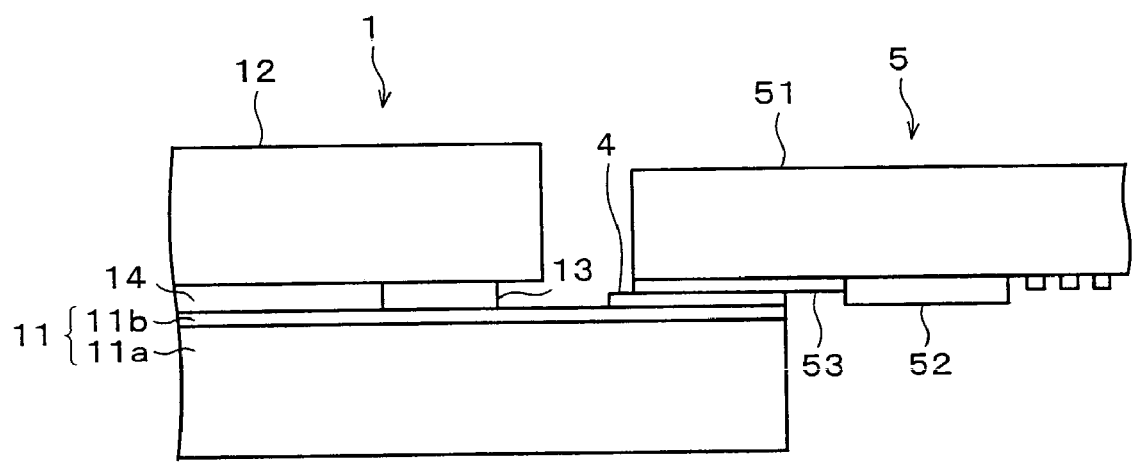
FIG. 2, illustrating a cross-section taken along line A—A in FIG. 1, is a cross-sectional view showing the arrangement of a connecting part in the liquid crystal display device.

As shown in FIG. 2, the display panel 1 is fabricated by injecting liquid crystal 14 between a TFT substrate 11 which is a display panel side substrate and a color filter substrate 12 after the substrates are combined together with a sealing agent 13.

The TFT substrate 11 includes a glass substrate 11a and a wiring layer 11b formed thereon from various kinds of wiring (a wire or wires), pixels, etc. The color filter substrate 12 includes on a glass substrate a color filter made of a pigment-dispersed acrylic resin and an opposite electrode made of a transparent conductive film of, for example, ITO (Indium Tin Oxide). The liquid crystal 14, located between the two substrates, acts as a display medium layer which changes display-related state depending on voltage.

The TFT substrate 11 in the display panel 1 is, for example, an alumino-borosilicate glass substrate, 300 mm wide×222 mm long×0.7 mm thick. On the glass substrate are there provided various kinds of wiring made from an Al (aluminum) thin film, pixel electrodes, and TFTs (Thin Film Transistors) acting as switching elements.

The wiring provided on the display panel 1 include source bus lines (source wiring) and gate bus lines (gate wiring), as well as panel auxiliary wiring, terminal part side auxiliary wiring, non-terminal part side auxiliary wiring, and wiring in a panel which are formed in the same layer and by the same step as the gate bus lines along a peripheral part of an area where the pixel electrodes are formed. These kinds of auxiliary wiring are not necessarily formed in the same layer as the gate bus lines and may be formed in a different layer. An arrangement of the wiring will be detailed later.

The TFTs are located near intersections of the source bus lines and the gate bus lines and made of, for example, amorphous silicon as a semiconductor layer. The pixel electrodes are made of a transparent conductive film, for example, ITO, and connected to the source bus lines and the gate bus lines via the TFTs.

Now, the gate GS substrate 3 and the source GS substrate 5 for use in the liquid crystal display device will be described, taking the source GS substrate 5 as an example.

As shown in FIG. 2, the source GS substrate 5 includes, for example, a alumino-borosilicate glass sheet, 4.5 mm long×260 mm wide×0.5 mm thick, as a glass substrate 51 on which are there provided: a driving circuit 52 for driving the source bus lines of the display panel; and a wiring layer 53 containing various kinds of wiring, such as, source output wiring which is connected to the driving circuit, lead wiring, and auxiliary wiring. The wiring is made of, for example, aluminum. An arrangement of the various kinds of wiring will be detailed later. The driving circuit can be arranged from TFTs made of, for example, polycrystalline silicon used as a semiconductor layer. The gate GS substrate 3 has more or less the same arrangement as the source GS substrate 5.

The source GS substrate 5 and gate GS substrate 3 thus structured are electrically connected via an ACF (Anisotropic Conductive Film) 4 in a source terminal part area and a gate terminal part area of the TFT substrate 11 in the display panel 1. The connection may be made using, for example, an ACP (Anisotropic Conductive Paste) or if direct contact can be established between connected wiring (or terminals), using an NCP (Non-Conductive Resin Paste).

Next, a wiring arrangement and connection of the TFT substrate 11 and the source GS substrate 5 will be described in reference to FIG. 3. The wiring arrangement of the gate GS substrate 3 and the wiring connection between the TFT substrate 11 and the gate GS substrate 3 are almost the same as those for the source GS substrate 5, and detailed description thereof will be omitted.

The various kinds of wiring provided on the TFT substrate 11 includes gate bus lines 15, source bus lines 16, panel side auxiliary wiring 17, non-terminal side auxiliary wiring 18, terminal side auxiliary wiring 19, and wiring 20 in a panel.

Figure 3:
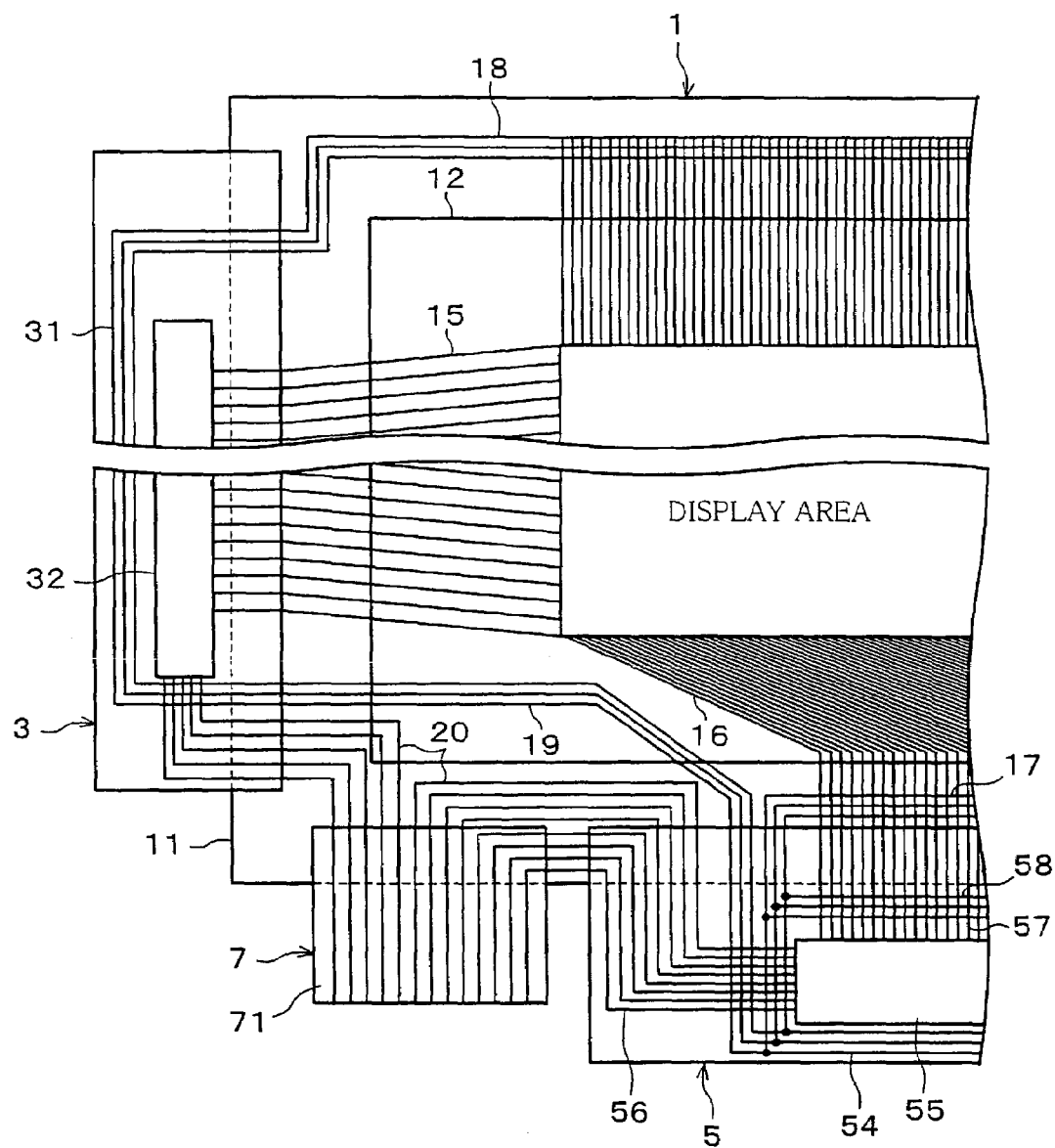
FIG. 3 is a plan view showing a wiring arrangement in the liquid crystal display device in detail.

The gate bus lines 15 and the source bus lines 16, with the pixel electrodes and the TFTs form a display area 21; however, no wiring is shown in the display area 21 in FIG. 3.

The panel side auxiliary wiring 17 is disposed intersecting the source bus lines 16 closer to the TFT substrate (i.e., the panel) than to a part (substrate connecting part) where the TFT substrate 11 is connected to the source GS substrate 5. An insulating film of, for example, silicon nitride is disposed between the panel side auxiliary wiring 17 and the source bus lines 16, electrically isolating the panel side auxiliary wiring 17 from the source bus lines 16. The panel side auxiliary wiring 17 is extended in those parts thereof where the wiring 17 does not intersect the source bus lines 16 so as to reach an area where the wiring 17 is connected to the source GS substrate 5.

The non-terminal side auxiliary wiring 18 is disposed on the TFT substrate 11, opposite to a side thereof where the substrate 11 is connected to the source GS substrate 5, so as to intersect the source bus lines 16 provided across the display area. The intersections of the non-terminal side auxiliary wiring 18 and the source bus lines 16 are connection wiring extended parts. An insulating film of, for example, silicon nitride is disposed between the non-terminal side auxiliary wiring 18 and the source bus lines 16, electrically isolating the non-terminal side auxiliary wiring 18 from the source bus lines 16. The non-terminal side auxiliary wiring 18 is extended in those parts thereof where the wiring 18 does not intersect the source bus lines 16 so as to reach an area where the wiring 18 is connected to the gate GS substrate 3.

The terminal side auxiliary wiring 19 is provided as wiring connecting auxiliary wiring in the gate substrate (will be detailed later) formed on the gate GS substrate 3 to auxiliary wiring 54 in a source substrate (will be detailed later) formed in the source GS substrate 5.

The wiring 20 in a panel is formed in the TFT substrate 11 to connect wiring supplying a drive signal and a power supply voltage (that is, drive voltage) to the gate driver 32 on the gate GS substrate 3 and the source driver 55 on the source GS substrate 5 between the FPC 7 and the gate GS substrate 3 and between the FPC 7 and the source GS substrate 5.

The various kinds of wiring provided on the source GS substrate 5 includes the auxiliary wiring 54 in a source substrate, source input wiring 56, source output wiring 57, and driver side auxiliary wiring 58.

The source input wiring 56 is to supply a drive signal and a drive voltage from the FPC 7 to the source driver 55, and for this purpose, connected to signal input wiring 71 via the wiring 20 in a panel in the TFT substrate 11. On the FPC 7, the signal input wiring 71 is provided by, for example, patterning a copper (Cu) foil into wires on a polyimide base material.

The source output wiring 57 is to output a source signal produced by the source driver 55 to the source bus lines 16 on the TFT substrate 11. Each line of the source output wiring 57 is connected to a different one of the source bus lines 16 in the substrate connecting part.

The driver side auxiliary wiring 58 is disposed intersecting the source output wiring 57 closer to the GS substrate side (that is, driver side) than to a part (substrate connecting part) where the TFT substrate 11 is connected to the source GS substrate 5. An insulating film of, for example, silicon nitride is disposed between the driver side auxiliary wiring 58 and the source output wiring 57, electrically isolating the driver side auxiliary wiring 58 from the source output wiring 57. The driver side auxiliary wiring 58 is extended in those parts thereof where the wiring 58 does not intersect the source output wiring 57 so as to reach an area where the wiring 58 is connected to the TFT substrate 11.

The auxiliary wiring 54 in a source substrate forms a part of connection wiring electrically connecting the driver side auxiliary wiring 58 on the source GS substrate 5 to the non-terminal side auxiliary wiring 18 on the TFT substrate 11. That is, the driver side auxiliary wiring 58 and the non-terminal side auxiliary wiring 18 are electrically connected via the auxiliary wiring 54 in a source substrate, the terminal side auxiliary wiring 19, and auxiliary wiring 31 in a gate substrate.

In this manner, in the liquid crystal display device, the auxiliary wiring 8 as shown in FIG. 1 is formed by connecting the panel side auxiliary wiring 17, the driver side auxiliary wiring 58, the auxiliary wiring 54 in a source substrate, the terminal side auxiliary wiring 19, the auxiliary wiring 31 in a gate substrate, and the non-terminal side auxiliary wiring 18. In the auxiliary wiring 8, the panel side auxiliary wiring 17 and the driver side auxiliary wiring 58 form auxiliary wiring for correction of a substrate connecting part. The driver side auxiliary wiring 58, the auxiliary wiring 54 in a source substrate, the terminal side auxiliary wiring 19, the auxiliary wiring 31 in a gate substrate, and the non-terminal side auxiliary wiring 18 form auxiliary wiring for correction of connection wiring.

The auxiliary wiring 8 is made up of two wires in the arrangement in FIG. 1 and three wires in that in FIG. 3. In the present invention, the number of wires in the auxiliary wiring 8 is dictated by a required possible number of corrections and not limited in any particular manner (a single wire or wires will do).

When the auxiliary wiring 8 involves two or more wires, different auxiliary wires are not electrically connected mutually. Accordingly, where different auxiliary wires intersect each other, an insulating film is disposed there between so that the auxiliary wires are provided in a multilayer structure. Therefore, in some cases, part of the auxiliary wiring is formed below a topmost layer. To connect the auxiliary wiring to auxiliary wiring formed on another substrate in the substrate connecting part, however, the auxiliary wiring needs to be formed as the topmost layer at least in the substrate connecting part. In such a case, all the auxiliary wiring is formed as the topmost layer at least in the substrate connecting part, and if the same auxiliary wiring to be connected to this is formed underneath, the auxiliary wiring formed in different layers may be electrically connected together in a contact hole formed at their intersections. Connection may be made in a contact hole in other events too if design requires that wires which will form the same auxiliary wiring be formed in different layers.

Here, an example will be described of a method of manufacturing a liquid crystal display device in accordance with the present embodiment.

The TFT substrate 11 constituting the display panel 1 is manufactured by the following method. First, titanium, aluminum, and titanium nitride films are sequentially deposited on a 0.7 mm thick glass substrate by sputtering and etched by photolithography and dry etching to form the gate bus lines 15, gate electrodes (not shown), gate side connecting terminals (not shown), the panel side auxiliary wiring 17, the terminal side auxiliary wiring 19, the wiring 20 in a panel, and source side connecting terminals (not shown).

Next, a silicon nitride film which will be a gate insulating film, a pure amorphous silicon layer which will be a semiconductor layer, and an n$^+$ amorphous silicon layer which will be a source electrode contact layer and a drain electrode contact layer are sequentially deposited by plasma CVD. Thereafter, using photolithography and dry etching, contact holes (not shown) are formed through the silicon nitride film above the gate side connecting terminals and the source side connecting terminals, and the n$^+$ amorphous silicon layer and the pure amorphous silicon layer are patterned into islands.

Next, an ITO film which is a transparent conductive film, a tantalum film, and a tantalum nitride film are sequentially deposited by sputtering. The source bus lines 16, source electrodes (not shown), and drain electrodes (not shown) are formed by photolithography and etching. Here, the source bus lines 16 and the source side connecting terminals are electrically connected together in contact holes made through the silicon nitride film which is a gate insulating film.

The source electrodes and the drain electrodes are isolated from each other on the island pattern made of the n$^+$ amorphous silicon layer and the pure amorphous silicon layer.

The n$^+$ amorphous silicon layer and the pure amorphous silicon layer are then etched to form the source electrode contact layer (not shown), the drain electrode contact layer (not shown), and channel areas (not shown) which constitute TFTs.

Next, a silicon nitride film which will be a protection layer is deposited by plasma CVD, and above the drain electrodes, patterned into contact holes in which the drain electrodes are electrically connected to pixel electrodes. Then, an ITO film which will be a transparent conductive film is deposited and patterned by sputtering into the pixel electrodes (not shown).

An alignment film of a polyimide resin is formed on the substrate obtained in the foregoing and subjected to rubbing as an aligning treatment. The steps so far completes the fabrication of the TFT substrate 11 which constitutes a part of the display panel 1.

Upon completion of the fabrication of the TFT substrate 11 by the steps, a conductive layer is exposed at the gate side connecting terminals and the source side connecting terminals so as to allow for external electric connection.

The following will now describe a method of manufacturing the color filter substrate 12 which is a part of the display panel 1. First, a pigment-dispersed color filter containing an acrylic resin as a base material is formed on a 0.7 mm thick glass substrate. On the color filter, an ITO film which is transparent and conductive is formed as an opposite electrode by sputtering. An alignment film of a polyimide resin is further formed and subjected to rubbing as an aligning treatment. The steps so far completes the fabrication of the color filter substrate 12 which constitutes a part of the display panel 1.

Then, a sealing agent is applied to the color filter substrate 12 by a screen printing technique, and a spacer material is scattered on the TFT substrate 11 by dry scattering. The color filter substrate 12 and the TFT substrate 11 are combined so that planes on which their alignment films are formed face each other, separated by a constant distance. By injecting liquid crystal between the color filter substrate 12 and the TFT substrate 11, the display panel 1 is produced.

The following will describe a method of forming the source GS substrate 5 (the gate GS substrate 3 is formed by a similar method).

The source driver 55 using polysilicon thin film transistors, the source output wiring 57 connected to the source driver 55, and connecting terminals are formed on an alumino-borosilicate glass substrate by a method similar to that for the TFT substrate 11 in the display panel 1.

The following will describe a method of connecting the TFT substrate 11 in the display panel 1 to the source GS substrate 5 (the TFT substrate 11 is connected to the gate GS substrate 3 by a similar method).

This is done by first stacking the connecting terminals of the source GS substrate 5 and those of the TFT substrate 11 via an ACF so that the side of the source GS substrate 5 on which the source driver 55 is formed opposes a source side terminal part area of the TFT substrate 11 and then pressing a tool heated to 300 degrees Celsius to the stack. The tool is made of an alloy tool steel material.

The following will describe a method of connecting the TFT substrate 11 to the FPC 7.

The TFT substrate 11 is connected to the FPC 7 by stacking the connecting terminals of the FPC 7 and those of the TFT substrate 11 so that they oppose each other via an ACF and then pressing a tool heated to 300 degrees Celsius to the stack.

In this manner, the liquid crystal display device in accordance with the present embodiment is formed.

Figure 4:
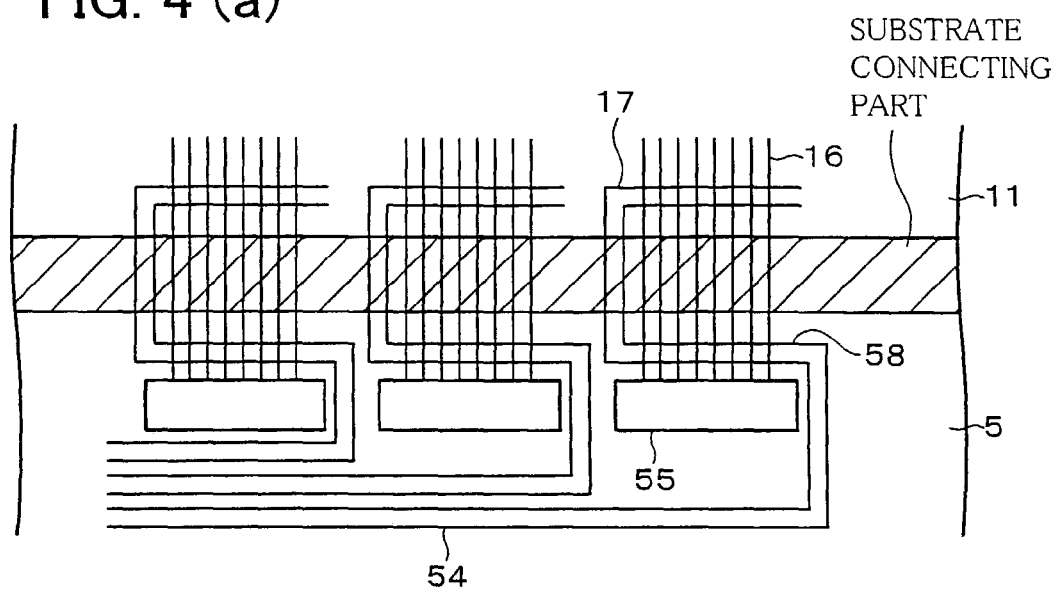
FIG. 4(a) is a plan view showing an example of connection between driver side auxiliary wiring and auxiliary wiring in a source substrate in a liquid crystal display device in cases where the auxiliary wiring in a source substrate is not shared.
FIG. 4(b) is a plan view showing an example of connection between driver side auxiliary wiring and auxiliary wiring in a source substrate in a liquid crystal display device in cases where the auxiliary wiring in a source substrate is shared.
Figure 4:
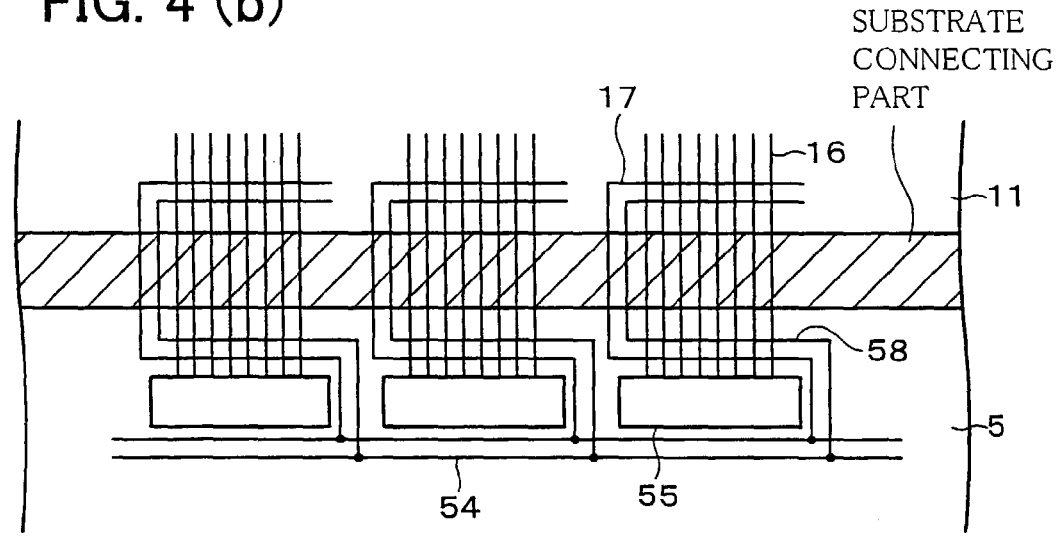

In the liquid crystal display device, divisional drive is generally performed to prevent degradation of power supply voltage, whereby the source bus lines 16 are divided into groups of a few adjacent lines so that each group is driven by a different source driver 55. When this is the case, the panel side auxiliary wiring 17 and the driver side auxiliary wiring 58 in the auxiliary wiring 8 are provided separately for individual source drivers 55. However, the auxiliary wiring 54 in a source substrate, the terminal side auxiliary wiring 19, the auxiliary wiring 31 in a gate substrate, and the non-terminal side auxiliary wiring 18 may be provided separately for individual source drivers 55 or individual sets of source drivers 55 (not necessarily commonly shared by all the source drivers 55). FIG. 4(a) shows an arrangement in which the auxiliary wiring 54 in a source substrate, the terminal side auxiliary wiring 19, the auxiliary wiring 31 in a gate substrate, and the non-terminal side auxiliary wiring 18 are provided separately for individual source drivers 55; FIG. 4(b) shows an arrangement in which they are provided separately for individual sets of source drivers 55.

The foregoing described an arrangement of the auxiliary wiring on the source side. Auxiliary wiring can be provided on the gate side in a similar design.

The following presents specific arrangement examples of the pitch and width of individual wiring in the liquid crystal display device arranged as in the foregoing. The dimensions below are not applicable to the entire wiring, but to at least connecting terminals in the substrate connecting part.

Connecting Part Between FPC 7 and TFT Substrate 11:
Wire Pitch 0.3 mm; Width of Signal Input Wire 71 (Width of FPC Terminal) 0.1 mm; Width of Wire 20 in Panel (Width of TFT Panel Terminal) 0.2 mm.

Connecting Part between TFT substrate 11 and Gate GS Substrate 3 or Source GS Substrate 5 (Distribution Wiring for Driving Circuit Driving Signal and Power/Auxiliary Wiring (Distribution Part)):
Wire Pitch 0.3 mm; Width of Non-Terminal Side Auxiliary Wire 18 and Terminal Side Auxiliary Wire 19 (Width of TFT Panel Terminal) 0.2 mm; Width of Auxiliary Wire 31 in Gate Substrate, Auxiliary Wire 54 in Source Substrate, Gate Input Wire and Source Input Wire 56 (Width of GS Substrate Terminal) 0.1 mm.

Connecting Part between TFT Substrate 11 and Gate GS Substrate 3 or Source GS Substrate 5 (Output Signal Connecting Part to Panel Picture Element Part):

Wire Pitch 0.07 mm; Width of Source Bus Line 16 (Width of TFT Panel Terminal) 0.04 mm; Source Output Wiring 57 (Width of GS Substrate Terminal) 0.04 mm (Source Side).

Wire Pitch 0.1 mm; Width of Panel Side Auxiliary Wire 17 (Width of TFT Panel Terminal) 0.07 mm; Width of Driver Side Auxiliary Wire 58 (Width of GS Substrate Terminal) 0.04 mm (Source Side Auxiliary Wiring)

Wire Pitch 0.2 mm; Width of Gate Bus Lines 15 (Width of TFT Panel Terminal) 0.1 mm; Width of Gate Output Wiring (Width of GS Substrate Terminal) 0.1 mm (Gate Side)

In the liquid crystal display device having the foregoing arrangement, auxiliary wiring is installed which corrects connection defects which occur in the connecting part between the TFT substrate 11 which is a display panel side substrate and the source GS substrate 5 (or gate GS substrate 3) which is a driving circuit side substrate. This allows correction which was conventionally done by replacing the driving circuit substrate to be done using a laser. Accordingly, the number of steps required for the correction can be greatly reduced, and attempts are allowed for to reduce labor costs and improve throughputs.

Further, driving circuit side substrates with a connection defect do not need to be disposed of, and materials costs can be reduced.

Further, secondary defects which occur in correcting are restrained. At the same time, a module can be offered which is less likely to develop secondary defects and therefore highly reliable.

In addition, damage (wire cut-offs at connecting terminals) to display panels in replacing and correcting the circuit substrate can be prevented.

The following will describe a method of correcting connection defects which have developed in a substrate connecting part in a liquid crystal display device with auxiliary wiring structured as in the foregoing.

FIG. 5(a) shows a first method of correcting leakage caused by contamination of a substrate connecting part by a conductive foreign object 9a. FIG. 5(a) shows the foreign object 9a causing leakage from two adjacent source bus lines for the output of source signals X and Y.

The conductive foreign object 9a is typically a few tens of micrometers thick; it is difficult to cut the object 9a with, for example, a laser through a glass substrate, auxiliary wiring is required for correction. Accordingly, signal lines for the output of signals X and Y, that is, the source bus lines 16 and the source output wiring 57 are cut by a laser, and electrically isolated, at four sites inside the panel side auxiliary wiring 17 and the source output wiring 57 (indicated by "X" in the figure). The source bus lines 16 and the source output wiring 57 are about 3000 angstroms thick and can be cut by an excimer laser.

Next, the intersections of the source bus lines 16 for the output of signals X and Y and the panel side auxiliary wiring 17 and those of the source output wiring 57 and the driver side auxiliary wiring 58 are short-circuited by a laser at four sites (indicated by black circles in the figure).

The above operation enables the unique signals X and Y to be output to a display panel part through auxiliary wiring, bypassing the leaking sites (in the figure, the flows of the signals X and Y are indicated by bold lines).

FIG. 5(b), similarly to FIG. 5(a), shows a second method of correcting leakage caused by contamination of the connecting part by the conductive foreign object 9a.

Figure 5:
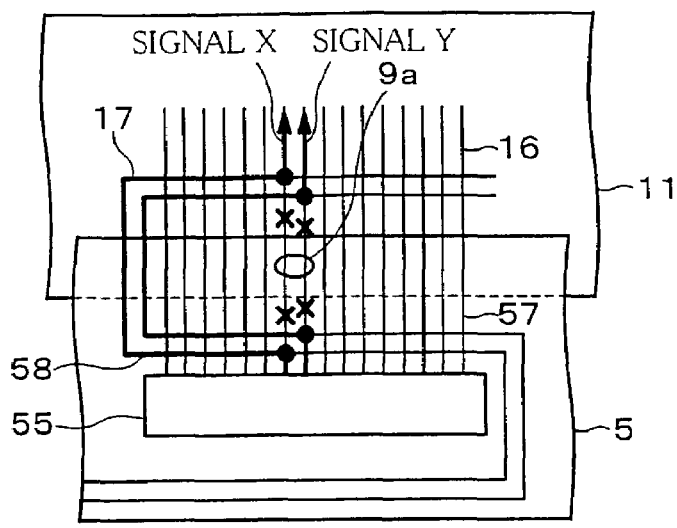
FIG. 5(a) is a plan view showing a first example of leakage correction in a substrate connecting part of a liquid crystal display device.
FIG. 5(b) is a plan view showing a second example of leakage correction in a substrate connecting part of a liquid crystal display device.
FIG. 5(c) is a plan view showing an example of opening correction in a substrate connecting part of a liquid crystal display device.
Figure 5:
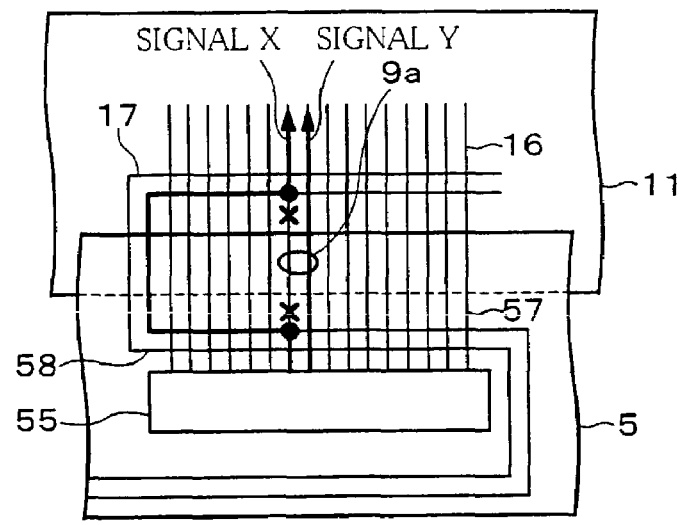
Figure 5:
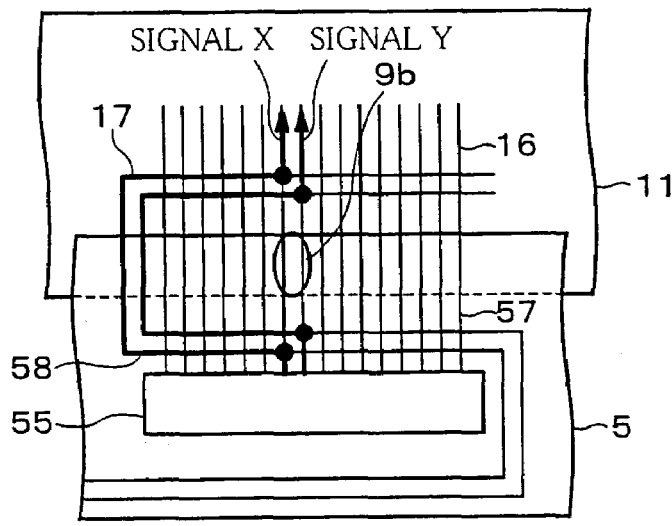

The foreign object 9a is causing leakage from signal lines for the output of the signals X and Y in the arrangement shown in FIG. 5(b), as it is in FIG. 5(a). Difference is found where only the signal line and auxiliary wiring for the signal X are cut and short-circuited to bypass the leaking site. As a result, the signal X flows through the auxiliary wiring, but the signal Y does not. The signal Y flows from the source driver 55 to the display panel via the source output wiring 57 and the source bus lines 16. This correction method produces comparable effects to those of the method illustrated in FIG. 5(*a*).

FIG. 5(*c*) shows a method of correcting a gap or opening 9*b* (connection defects obstructing electrical connection between connecting terminals through an ACF, caused by an non-conducting foreign object or air bubble) in a substrate connecting part.

In this case, the intersections of the signal lines for the output of the signals X and Y and the auxiliary wiring are short-circuited by a laser at four sites. As a result, The signals X and Y output from the source driver 55 travel to a display panel part via the auxiliary wiring, bypassing the opening sites (in the figure, the flows of the signals X and Y are indicated by bold lines).

The correction methods were described for only either of the cases: leakage or opening. Combinations of the methods are applicable to connection defects cases where leakage and opening have both occurred. When this is the case, it is important to understand the tendency in the development of defects and adjust the number of auxiliary wires in the design stage.

The description for FIGS. 5(*a*) to 5(*c*) dealt with correction of connection defects of auxiliary wiring in a substrate connecting part. A wire breaking defect of a source bus line (or gate bus line) of the liquid crystal display device in accordance with the present embodiment can also be corrected using auxiliary wiring.

Figure 6:
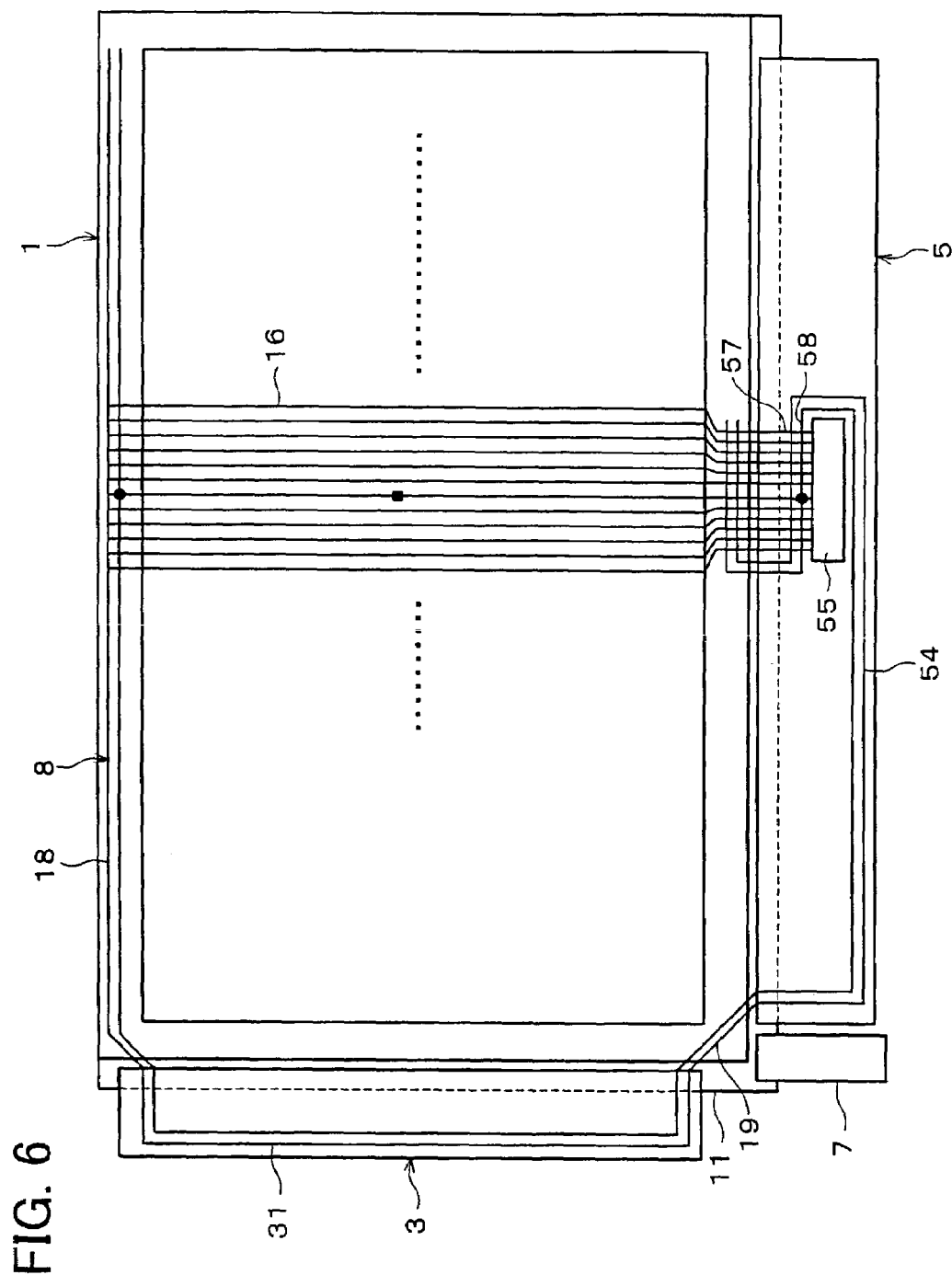
FIG. 6 is a plan view showing an example of correction of a source bus line break in the liquid crystal display device.

FIG. 6 shows an example of a liquid crystal display device having developed a source wire break. It is assumed in the example in FIG. 6 that the source bus line 16 has broken at the site indicated by a black square. Unless specifically corrected, the defect stops signal supply, inhibiting the signal output from the source drivers 55 from traveling further than the wire breaking site down the source bus line 16.

The defect is corrected by the following method. The source output wire 57 connected to the source bus line 16 with a break and the driver side auxiliary wire 58 are short-circuited by a laser at their intersection. Further, the source bus line 16 and the non-terminal side auxiliary wire 18 are short-circuited by a laser at their intersection outside the display area. Here, the driver side auxiliary wire 58 and the non-terminal side auxiliary wire 18 with the short-circuited site belong to the same auxiliary wire 8.

As a result, a signal travels down the source bus line 16 with a break via the source output wiring 57 and the source bus line 16 on the terminal side (that is, the side to which the source GS substrate 5 is connected) of the wire breaking site and via the driver side auxiliary wiring 58, the auxiliary wiring 54 in a source substrate, the terminal side auxiliary wiring 19, the auxiliary wiring 31 in a gate substrate, and the non-terminal side auxiliary wiring 18 on the non-terminal side (that is, the side to which the source GS substrate 5 is not connected).

In the arrangement of FIG. 6, the driver side auxiliary wiring 58 on the source GS substrate 5 is connected to the non-terminal side auxiliary wiring 18 on the TFT substrate 11 via the auxiliary wiring on the gate GS substrate 3 and the source GS substrate 5. Accordingly, upon correction of a break along the source bus lines 16, a signal supplied from the non-terminal side via the auxiliary wiring 8 does not pass through the intersection of that source bus line 16 and the panel side auxiliary wiring 17 with an insulating film intervening there between. This restrains parasitic capacitance and prevents the source signal voltage from becoming blunt. Further, a similar structure produces similar effects as to redundancy of a gate bus line.

In the present embodiment, the panel side auxiliary wiring 17 and the driver side auxiliary wiring 58 are preferably wider than the source bus lines 16 or the gate bus lines 15. This restrains the resistance to the propagation of a signal voltage in redundant wiring to approximately the same level as the resistance of the bus lines.

Specifying a greater width for the auxiliary wiring and the connecting terminal part renders the bus line resistance of a corrected line substantially equal to the bus line resistance where no correction is made. This restrains display irregularities caused by variations in resistance from one bus line to another, allowing for attempts to improve display quality.

Figure 7:
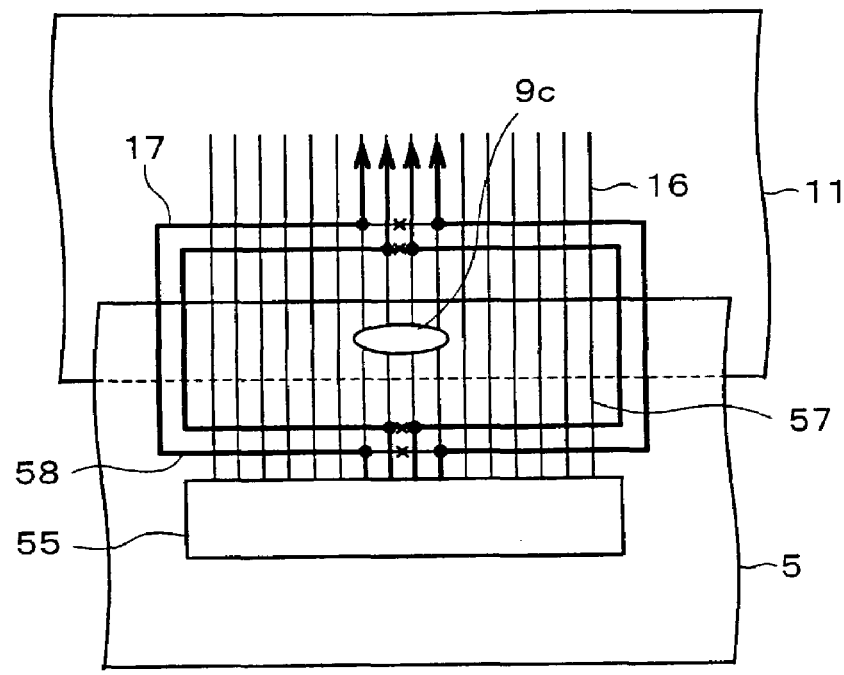
FIG. 7(a) is a plan view showing an example of opening correction in a substrate connecting part of the liquid crystal display device.
FIG. 7(b) is a plan view showing an example of leakage correction in a substrate connecting part of the liquid crystal display device.
Figure 7:
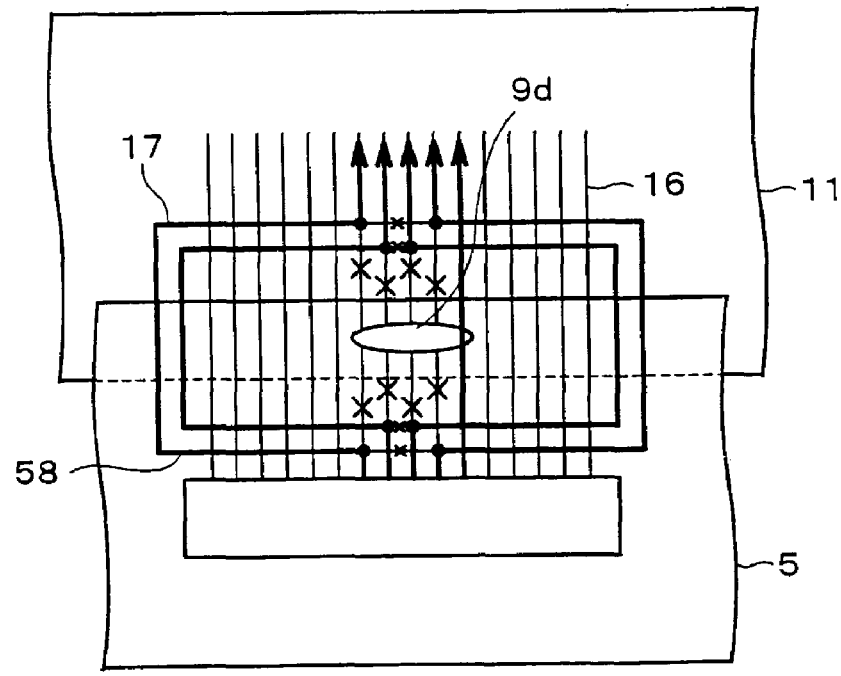

The arrangements in the description are mere examples and by no means limiting the present invention which can be modified in various ways. FIG. 7(*a*) and FIG. 7(*b*) show examples of such modifications to the auxiliary wiring in a substrate connecting part.

In the arrangements shown in FIGS. 7(*a*), 7(*b*), the panel side auxiliary wiring 17 and the driver side auxiliary wiring 58 are disposed to bypass the sides of source bus lines 16 driven by a common source driver 55. Thus, the auxiliary wiring (that is, the panel side auxiliary wiring 17 and the driver side auxiliary wiring 58) is disposed to encircle the connecting area between the source bus lines 16 and the source output wiring 57. FIGS. 7(*a*), 7(*b*) show an arrangement in which there are auxiliary wires; the number of wires is however not limited.

The following will describe a correction method applied to a substrate connecting part in the foregoing arrangement. First, FIG. 7(*a*) shows a correction method for cases where a substrate connecting part has developed an opening defect. For example, the panel side auxiliary wiring 17 and the driver side auxiliary wiring 58 are cut by a laser (in the figure, indicated by "X") between the second and third of the signal lines (here, there are four) across which the opening defect site 9*c* has occurred. This enables the two auxiliary wires disposed encircling the connecting area to be used as four independent auxiliary wires.

Further, with respect to the four corrected signal lines, the intersections of the source bus lines 16 and the panel side auxiliary wiring 17 are short-circuited by a laser, and the intersections of the source output wiring 57 and the driver side auxiliary wiring 58 are short-circuited by a laser. The sites short-circuited in the action are indicated by black circles in the figure. The outer two of the four corrected signal lines are connected by outer auxiliary wiring, and the inner two are connected by inner auxiliary wiring. This method is capable of correcting openings of signal lines which may as many as double the auxiliary wires.

Next, FIG. 7(*b*) shows a correction method for cases where a substrate connecting part has developed a leaking defect. For example, the panel side auxiliary wiring 17 and the driver side auxiliary wiring 58 are cut by a laser (in the figure, indicated by "X") between the second and third of the signal lines (here, there are five) across which the leaking defect site 9*d* has occurred. This enables the two auxiliary wires disposed encircling the connecting area to be used as four independent auxiliary wires. Further, the first to fourth, from left to right, of the five signal lines across which the leaking defect site 9d has occurred are cut off the leaking defect site 9d (in the figure, indicated by "X") inside the auxiliary wiring.

Further, the first to fourth, from left to right, of the five corrected signal lines are short-circuited by a laser at their intersections with the source bus lines 16 or the panel side auxiliary wiring 17 and also at their intersections with the source output wiring 57 and the driver side auxiliary wiring 58. The sites short-circuited in the action are indicated by black circles. The outer two of the four corrected signal lines are connected by outer auxiliary wiring, and the inner two are connected by inner auxiliary wiring. The far right one of the five signal lines having developed the leaking defect site 9d is made independent as a result of separation from the remaining four signal lines. This method is capable of correcting leaks of signal lines which may as many as double the auxiliary wires plus one.

In the arrangements shown in FIGS. 7(a), 7(b), as long as a defect has occurred at less places than the number of corrections that auxiliary wiring can handle, the parasitic capacitance in the auxiliary wiring can be restrained by reducing the number of signal lines which intersect auxiliary wiring used in correction.

Figure 8:
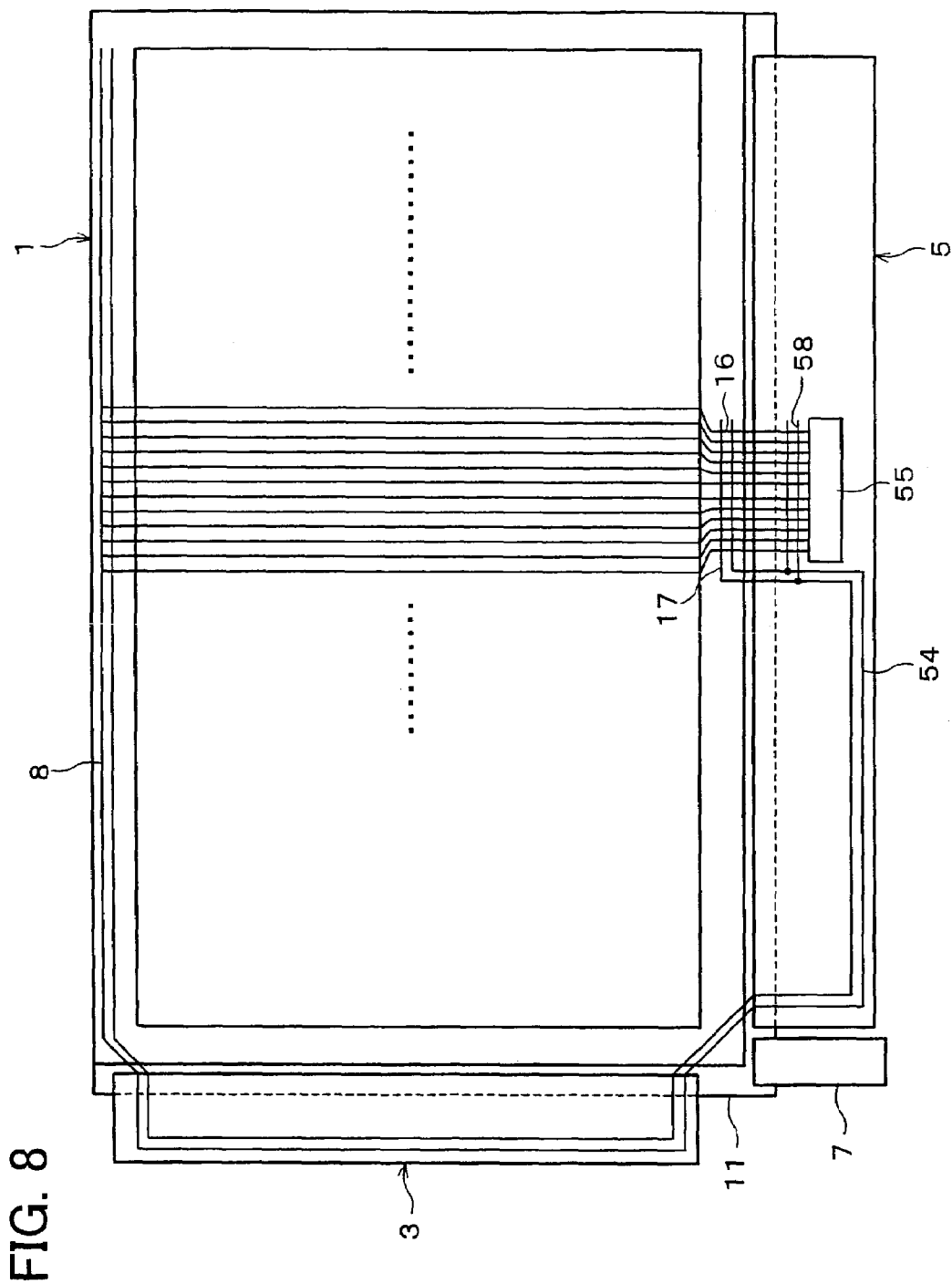
FIG. 8 is a plan view showing an example of connection, different from the one in FIG. 1, between driver side auxiliary wiring and auxiliary wiring in a source substrate in the liquid crystal display device.
Figure 9:
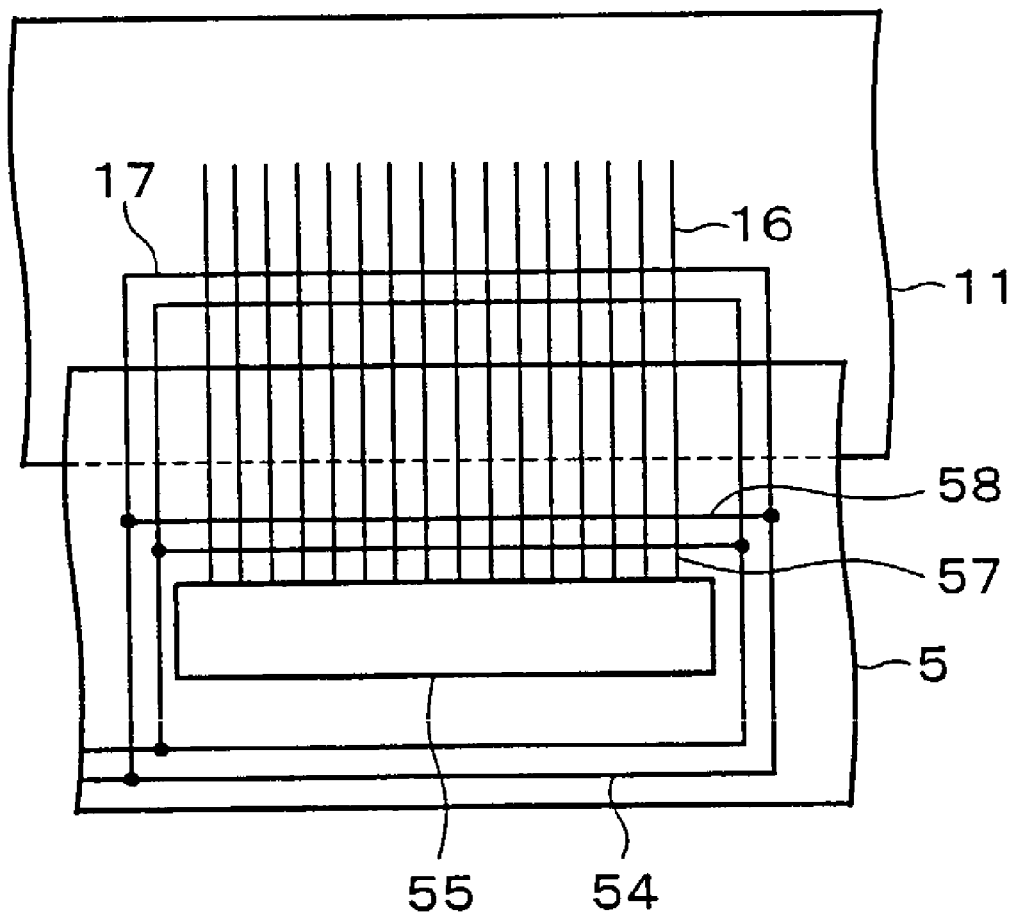
FIG. 9 is a plan view showing an example of a modified connection arrangement between panel side auxiliary wiring and driver side auxiliary wiring in the liquid crystal display device.
Figure 10:
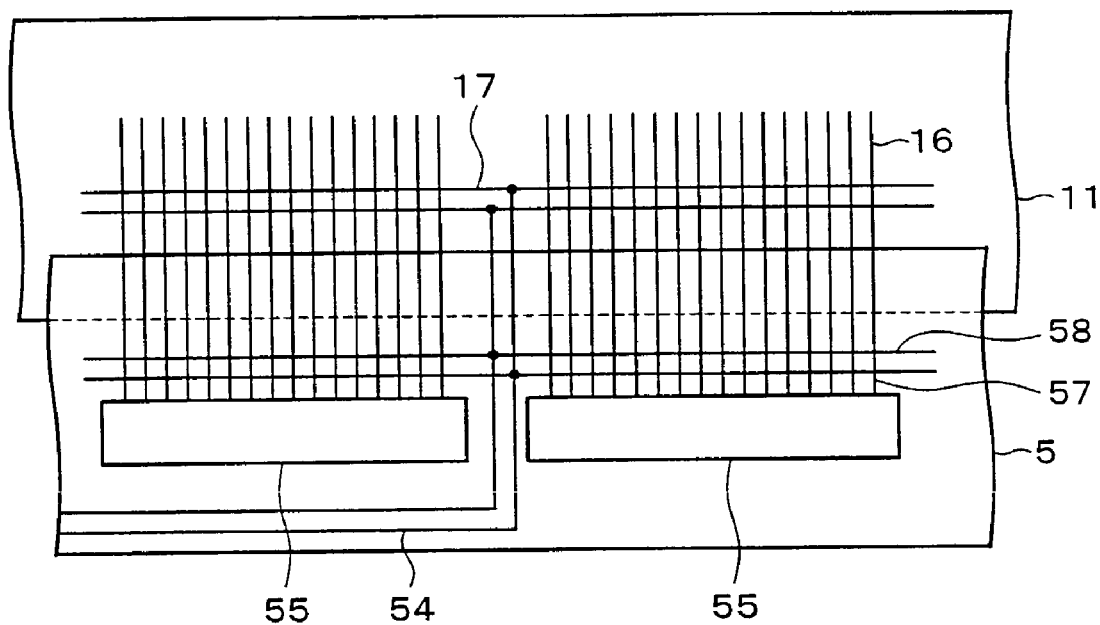
FIG. 10 is a plan view showing an example of a modified connection arrangement between panel side auxiliary wiring and driver side auxiliary wiring in the liquid crystal display device.
Figure 11:
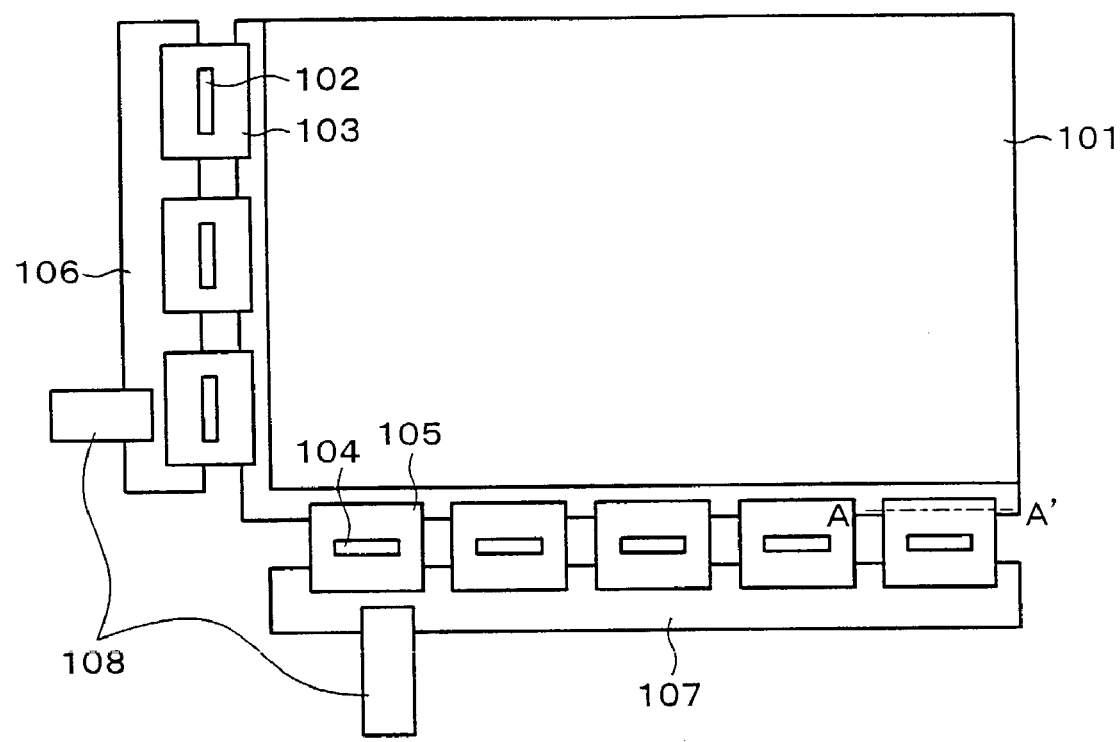
FIG. 11 is a schematic plan view showing a conventional TCP display device.
Figure 12:
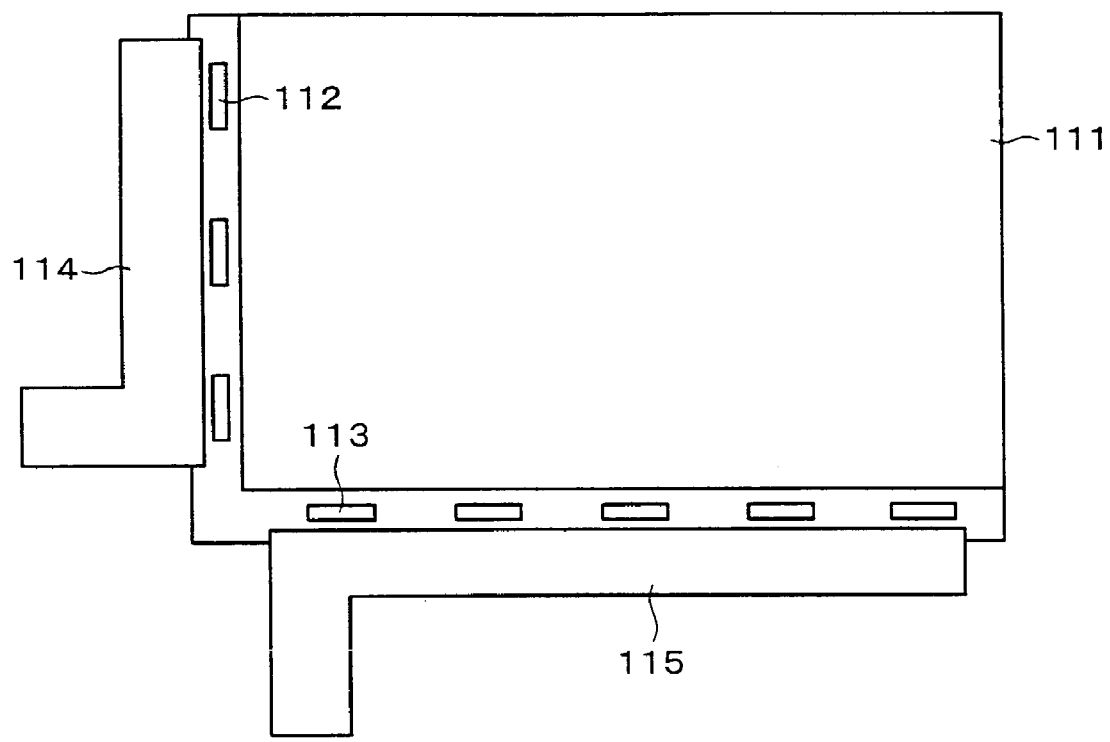
FIG. 12 is a schematic plan view showing a conventional COG display device.
Figure 13:
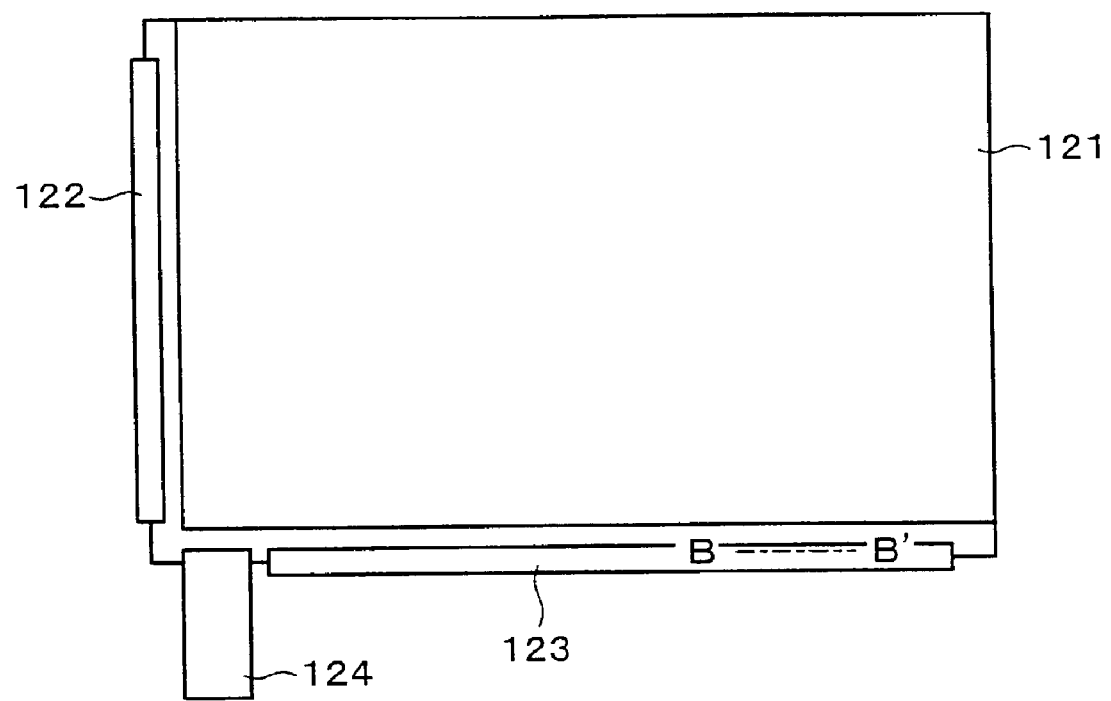
FIG. 13 is a schematic plan view showing a conventional GOG display device.
Figure 14:
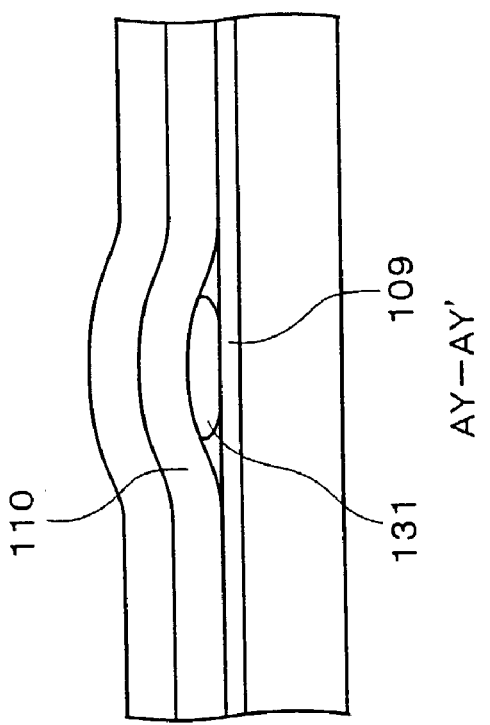
FIG. 14(a) is a cross-sectional view taken along line A–A' in FIG. 11.
FIG. 14(b) is a cross-sectional view taken along line AY–AY' in FIG. 14(a), both showing a state of a place where a defect has occurred in a TCP substrate connect.
Figure 14:
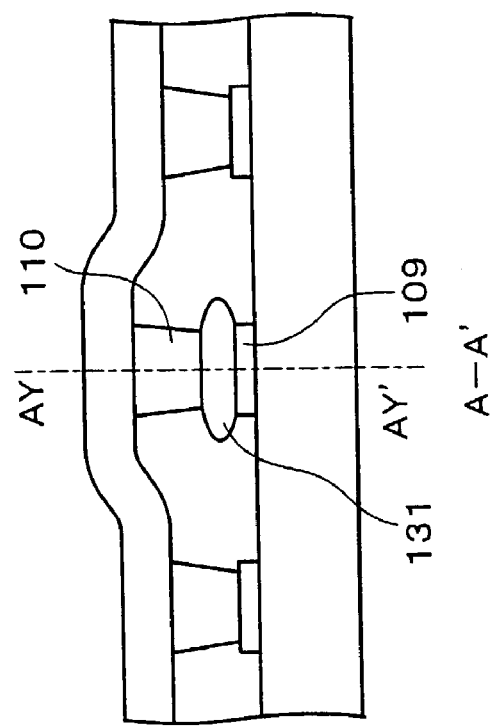
Figure 15:
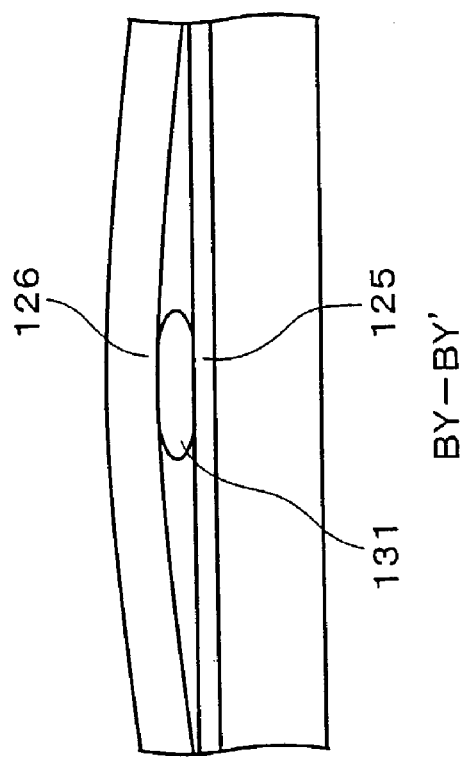
FIG. 15(a) is a cross-sectional view taken along line B–B' in FIG. 13.
FIG. 15(b) is a cross-sectional view taken along line BY–BY' in FIG. 15(a), both showing a state of a place where a defect has occurred in a GOG substrate connect.
Figure 15:
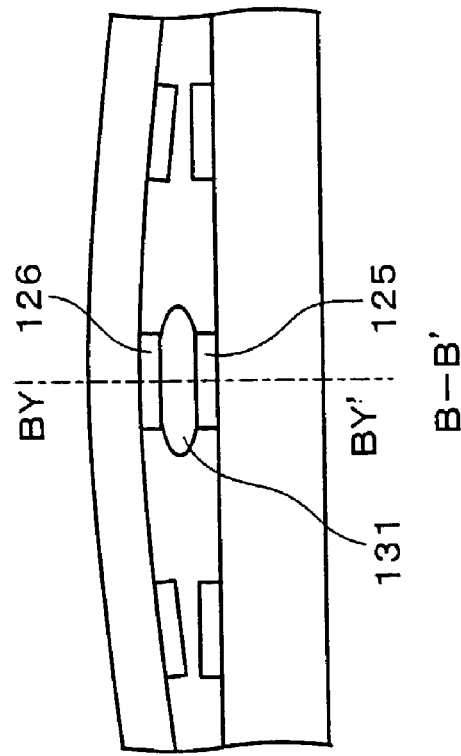

FIG. 8 through FIG. 10 show examples of modifications to the connection arrangement of the driver side auxiliary wiring 58 and the auxiliary wiring 54 in a source substrate.

In the arrangement in FIG. 1, the panel side auxiliary wiring 17, the driver side auxiliary wiring 58 and the auxiliary wiring 54 in a source substrate are arranged to form a figure "S" (the connecting site between the panel side auxiliary wiring 17 and the driver side auxiliary wiring 58 and the connecting site between the driver side auxiliary wiring 58 and the auxiliary wiring 54 in a source substrate are arranged on opposite sides of the area where the source bus lines 16 and the source output wiring 57 are formed so as to sandwich that area). Meanwhile, in the arrangement in FIG. 8, the panel side auxiliary wiring 17, the driver side auxiliary wiring 58, and the auxiliary wiring 54 in a source substrate are arranged to form a figure "F" (the connecting site between the panel side auxiliary wiring 17 and the driver side auxiliary wiring 58 and the connecting site between the driver side auxiliary wiring 58 and the auxiliary wiring 54 in a source substrate are arranged only on one side of the area where the source bus lines 16 and the source output wiring 57 are formed).

In the arrangement in FIG. 9, the panel side auxiliary wiring 17, the driver side auxiliary wiring 58, and the auxiliary wiring 54 in a source substrate are arranged to form a figure "8" (the panel side auxiliary wiring 17 and the driver side auxiliary wiring 58 are connected in connecting sites on opposite sides of the area where the source bus lines 16 and the source output wiring 57 are formed so as to sandwich that area, and the driver side auxiliary wiring 58 and the auxiliary wiring 54 in a source substrate are connected in connecting sites on opposite sides of the area). In this arrangement, in correcting a break of the source bus lines 16, the parasitic capacitance of the driver side auxiliary wiring 58 is reduced by reducing the number of source output wires 57 intersecting the driver side auxiliary wiring 58 used in the correction according to the site where the source bus line have broken.

Additionally, according to the above description, since the panel side auxiliary wiring 17 and the driver side auxiliary wiring 58 are arranged on opposite sides of the area where the source bus lines 16 and the source output wiring 57 are formed so as to sandwich that area, an opening which has developed in the connection to either one of the panel side auxiliary wiring 17 and the driver side auxiliary wiring 58 can be corrected using the connection to the other one of the panel side auxiliary wiring 17 and the driver side auxiliary wiring 58.

Additionally, in the arrangement in FIG. 10, auxiliary wiring is arranged with two source drivers 55 treated as forming a single block. That is, the panel side auxiliary wiring 17 and the driver side auxiliary wiring 58 are arranged covering a plurality of source bus lines 16 and source output wiring 57 driven by the two source drivers 55. The auxiliary wiring 54 in a source substrate is connected to the driver side auxiliary wiring 58 at the center thereof (between the two source drivers 55). Further, in the arrangement in FIG. 10, a source signal is drawn to the non-terminal side auxiliary wiring 18 via two lines for two blocks.

Additionally, in the above description, the driver side auxiliary wiring 58 and the non-terminal side auxiliary wiring 18 are connected using auxiliary wiring with the intervening gate GS substrate 3 and source GS substrate 5. However, the driver side auxiliary wiring 58 and the non-terminal side auxiliary wiring 18 may be connected only inside the TFT substrate 11. When this is the case, it is sufficient if the non-terminal side auxiliary wiring 18 is connected to the panel side auxiliary wiring 17.

However, in an arrangement where the driver side auxiliary wiring 58 and the non-terminal side auxiliary wiring 18 are connected only inside the TFT substrate 11, the source bus lines 16 are intersected at too many sites, and the parasitic capacitance of the auxiliary wiring increases; an arrangement is preferred in which the driver side auxiliary wiring 58 and the non-terminal side auxiliary wiring 18 are connected using auxiliary wiring with a gate GS substrate 3 and a source GS substrate 5 intervening there between. Additionally, in the above description, the driver side auxiliary wiring 58 and the non-terminal side auxiliary wiring 18 are connected via two driving circuit side substrates: the gate GS substrate 3 and the source GS substrate 5. Only one of the driving circuit side substrates may be used for the connection (the driver side auxiliary wiring 58 and the non-terminal side auxiliary wiring 18 are connected by the source GS substrate 5).

In the present embodiment, a case was described in which the present invention was applied to a liquid crystal display device. This is by no means limiting the present invention. The present invention is applicable to any display device having a terminal part, such as plasma display devices and organic EL display devices.

Additionally, the present invention is not limited to applications to the connecting of a display panel side substrate and a driving circuit side substrate in active matrix types of liquid crystal display devices. That is, the present invention is applicable to any structure of a substrate connecting part, provided that the substrate connecting part connects wires on circuit substrates together in connecting those circuit substrates together. The invention does not limit the use of the circuit substrates.

As described, the wiring substrate connection structure in accordance with the present embodiment, for connecting two wiring substrates in such a manner that a plurality of connection wirings formed on respective wiring substrates are electrically connected in a substrate connection part, is arranged such that:

each of the wiring substrates comprises at least one auxiliary wiring formed so as to cross the plurality of connection wirings formed on each of the wiring substrates via an insulating film; and in the substrate connection part, not only the plurality of connection wirings but also the auxiliary wiring formed on one of the wiring substrates are connected respectively to the plurality of connection wirings and the auxiliary wiring formed on the other wiring substrate.

The wiring substrate connected structure in accordance with the present embodiment, for electrically connecting a plurality of connection wirings formed on one of a pair of wiring substrates and a plurality of connection wirings formed on the other of the pair of wiring substrates in a substrate connection part, may be arranged such that:

each of the pair of wiring substrates comprises at least one auxiliary wiring formed so as to cross the plurality of connection wirings formed on each of the pair of wiring substrates via an insulating film; and in the substrate connection part, not only the plurality of connection wirings but also the auxiliary wiring formed one of the pair of wiring substrates are connected respectively to the plurality of connection wirings and the auxiliary wiring formed on the other of the pair of wiring substrates.

According to the foregoing structure, in an event of a connection inferior between the connection wirings caused by, for example, foreign substances being contaminated in the connection part of the wiring substrates, the connection inferior can be fixed by short-circuiting the connection wiring subjected to the connection inferior and the auxiliary wiring. Specifically, for example, in an event of an opening of the connection wiring in the substrate connection part, the connection wiring subjected to the opening and the auxiliary wiring are short-circuited by projecting a laser beam to an intersection between the connection wiring and the auxiliary wiring, so that a signal or a voltage can be applied to the connection wiring via the auxiliary wiring. Further, in an event of a leakage as a connection inferior, the connection wiring in a vicinity of the part subjected to leakage is cut off with an application of a laser beam, and then after separating the part subjected to leakage from the connection wiring, the connection wiring and the auxiliary wiring are short-circuited, so that a signal or a voltage can be applied to the connection wiring via the auxiliary wiring.

As a result, the connection inferior can be fixed with ease by projecting a laser beam without troublesome tasks of separating, cleaning, re-connecting the substrate for the connection of the substrate subjected to the connection inferior as required in the conventional correction method. Furthermore, an occurrence of secondary inferior such as a crack in the substrate when separating the substrate can be suppressed.

A display device in accordance with the present embodiment which comprises a display panel side substrate provided with a display area and a driving circuit side substrate provided with a driving circuit, in which a plurality of connection wirings formed on the display panel side substrate and a plurality of connection wirings formed on the driving circuit side substrate are electrically connected in a substrate connection part provided outside the display area, is arranged such that:

each of the display panel side substrate and the driving circuit side substrate comprises at least one auxiliary wiring formed so as to cross the plurality of connection wirings formed on each of the display panel side substrate and the driving circuit side substrate via an insulating film; and in the substrate connection part, the auxiliary wiring formed on the display panel side substrate is electrically connected to the auxiliary wiring formed on the driving circuit side substrate, to constitute a substrate connection part correction-use auxiliary wiring.

A display device in accordance with the present embodiment which comprises a display panel side substrate provided with a display area and a driving circuit side substrate provided with a driving circuit, in which a plurality of connection wirings formed on the display panel side substrate and a plurality of connection wirings formed on the driving circuit side substrate are electrically connected in a substrate connection part provided outside the display area, may be arranged such that:

each of the display panel side substrate and the driving circuit side substrate comprises at least one auxiliary wiring formed so as to cross the plurality of connection wirings formed on each of the display panel side substrate and the driving circuit side substrate via an insulating film; and in the substrate connection part, the auxiliary wiring formed on the display panel side substrate is electrically connected to the auxiliary wiring formed on the driving circuit side substrate, to constitute a substrate connection part correction-use auxiliary wiring.

According to the foregoing structure, for a liquid crystal display device or other active matrix type display device, a display panel and a driving circuit (gate driver or a source driver, etc.) can be formed on different substrates, and when forming a display device by connecting these substrates, the connection structure for connecting the connection wirings can be used for the connection between the display panel side substrate and the driving circuit side substrate.

As a result, the connection inferior can be fixed with ease by projecting a laser beam without troublesome tasks of separating, cleaning, re-connecting the substrate for the connection of the substrate subjected to the connection inferior as required in the conventional correction method. Furthermore, an occurrence of secondary inferior such as a crack in the substrate when separating the substrate can be suppressed.

The foregoing display device may be further arranged such that the driving circuit side substrate includes a plurality of driving circuits provided in parallel;

the plurality of connection wirings are divided into groups in such a manner that a plurality of connection wirings which are provided adjacent to one another belong to each group; and each of the plurality of driving circuits is electrically connected to the connection wirings and the auxiliary wiring belonging to each group.

The foregoing display device may be arranged so as to further include:

a connection wiring correction-use auxiliary wiring for correcting disconnection of a connection wiring formed on the display panel side substrate; and the connection wiring correction-use auxiliary substrate is connected to the substrate connection part correction-use auxiliary wiring, or may be arranged so as to further include a connection wiring correction-use auxiliary wiring, wherein the plurality of connection wirings formed on the display panel-side substrate extend to a connection wiring extended part provided outside the display area; and the connection wiring correction-use auxiliary wiring is electrically connected not only to the connection wirings formed on the display panel side substrate, but also to the substrate connection part correction-use auxiliary wiring in the connection wiring extended part.

According to the foregoing structure provided with the connection wiring correction use auxiliary wiring, in addition to the fixing of the connection inferior in the substrate connection part, the disconnection of the connection wiring (disconnection of the gate bus line or the source bus line) on the display panel side substrate can be fixed.

It is preferable that the foregoing display device be further arranged such that the connection wiring correction-use auxiliary wiring is connected to the substrate connection part correction-use auxiliary wiring via at least one driving circuit side substrate, the connection wiring correction-use auxiliary line extending from the auxiliary wirings formed on the driving circuit side substrate, which constitute the substrate connection part correction-use auxiliary wiring, or the connection wiring correction-use auxiliary wiring extends from the auxiliary wiring formed on the driving circuit-side substrate via at least an area where the connection wiring correction-use auxiliary wiring does not cross the plurality of connection wirings formed on at least one driving circuit side substrate.

The connection wiring correction-use auxiliary wiring and the substrate connection part auxiliary wiring are not necessarily be connected via the driving circuit side substrate, and may be connected only by means of wirings in the display panel side substrate. In this case, however, when supplying signals to the connection wirings via the connection wiring correction-use auxiliary wiring, the number of intersections between the connection wiring correction-use auxiliary wiring and the connection wirings increases, and parasitic capacitance generated from the connection wiring correction-use auxiliary wiring increases. In contrast, according to the foregoing structure of the present embodiment, the connection wiring correction-use auxiliary wiring is provided so as to extend from the auxiliary wiring formed on the driving circuit-side substrate via at least an area where the connection wiring correction-use auxiliary wiring does not cross the plurality of connection wirings formed on at least one driving circuit side substrate. Therefore, the number of intersections between the connection wiring correction-use auxiliary wiring and the connection wirings can be reduced, and parasitic capacitance generated from the connection wiring correction-use auxiliary wiring can be suppressed.

The foregoing display device may be further arranged such that the substrate connection part correction-use auxiliary wiring is formed in such a manner that the auxiliary wiring formed on the display panel side substrate and the auxiliary wiring formed on the driving circuit side substrate are connected so as to pass on both sides of the plurality of connection wirings in an alignment direction crossing these auxiliary wirings.

According to the foregoing structure, the substrate connection part correction-use auxiliary wiring is provided on both sides of the connection wirings in an alignment direction. Therefore, by separating the substrate connection part correction-use auxiliary wiring at the intersection with the connection wiring, a redundant wiring can be formed with respect to two connection wirings by means of a single substrate connection part correction-use auxiliary wiring. Namely, with this structure, by means of the substrate connection part correction-use auxiliary wirings in the number of n, parts subjected to opening in the number of 2n or parts subjected to leakage in the number of 2n+1 can be fixed.

As a result, the fixable number of inferior parts can be increased with an upper limit of an area where the substrate connection part correction-use auxiliary wiring is provided.

It is preferable that the foregoing display device be further arranged such that:

the substrate connection part correction-use auxiliary wiring is formed in such a manner that each of the auxiliary wirings formed on the display panel side substrate and the driving circuit side substrate is formed thicker than each of the plurality of connection wirings crossing these auxiliary wirings.

Here, in the case where the connection inferior is fixed by the substrate connection part correction-use auxiliary wiring, signals are applied are bypassed through the substrate connection part correction-use auxiliary wiring. Therefore, as compared to the signals transmitting applied through the connection wirings, the transmission part for the signals becomes longer.

In view of the foregoing, with an arrangement provided with a thicker substrate connection part correction-use auxiliary wiring, the resistance to the signal voltage as applied through the substrate connection part correction-use auxiliary wiring can be suppressed substantially to the resistance of the connection wiring. As a result, an uneven display due to differences in wiring resistances between the connection wirings can be suppressed, thereby realizing an improved display quality.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A wiring substrate connected structure for facilitating repairs in a display, comprising:

a substrate connected structure for connecting two wiring substrates in such a manner that a plurality of connection wirings formed on respective wiring substrates are electrically connected in a substrate connection part so that the plurality of connection wirings are provided on both of the two wiring substrates so that respective ones of the connection wires on a first of the wiring substrates are electrically connected to corresponding ones of the connection wires on a second of the wiring substrates, wherein:

each of said wiring substrates comprises at least one auxiliary wiring formed so as to cross said plurality of connection wirings formed on each of said wiring substrates via an insulating film, wherein the auxiliary wirings on the two wiring substrates are electrically connected to each other; and wherein the auxiliary wiring and the connection wirings on the first wiring substrate overlap each other on the first wiring substrate and the auxiliary wiring and the connection wirings on the second wiring substrate overlap each other on the second wiring substrate so as to facilitate an electrical connection between one of the connection wirings and both of the auxiliary wirings upon detection of a defect in the one connection wiring in an area outside of a display area and between the auxiliary wirings.

2. A wiring substrate connected structure for facilitating repairs in a display, comprising:

a substrate connected structure for electrically connecting a plurality of connection wirings formed on one of a pair of wiring substrates and a plurality of connection wiring formed on the other of said pair of wiring substrates in a substrate connection part so that the plurality of connection wirings are provided on both of the two wiring substrates so that respective ones of connection wires on a first of the wiring substrates are electrically connected to corresponding ones of connection wires on a second of the wiring substrates, wherein:

each of said pair of wiring substrates comprises at least one auxiliary wiring formed so as to cross said plurality of connection wirings formed on each of said pair of wiring substrates via an insulating film; and wherein the auxiliary wiring and the connection wirings on the first wiring substrate overlap each other on the first wiring substrate and the auxiliary wiring and the connection wirings on the second wiring substrate overlap each other on the second wiring substrate so as to facilitate an electrical connection between one of the connection wirings and both of the auxiliary wirings upon detection of a defect in the one connection wiring in an area outside of a display area and between the auxiliary wirings.

3. A display device comprising:

a display panel side substrate and a driving circuit side substrate that are connected in such a manner that a plurality of connection wirings formed on said display panel side substrate and a plurality of connection wirings formed on said driving circuit side substrate are electrically connected in a substrate connection part between said display panel side substrate and said driving circuit side substrate so that the plurality of connection wirings are provided on both of the two substrates so that respective ones of the connection wires on a first of the substrates are electrically connected to corresponding connection wires on a second of the substrates;

each of said display panel side substrate and said driving circuit side substrate comprises at least one auxiliary wiring formed so as to cross said plurality of connection wirings formed on each of said display panel side substrate and said driving circuit side substrate via an insulating film, wherein the auxiliary wirings on the two substrates are electrically connected to each other; and wherein the auxiliary wiring and the connection wirings on each of the substrates overlap each other so as to facilitate an electrical connection between one of the connection wirings and both of the auxiliary wirings upon detection of a defect in the one connection wiring in an area outside of a display area and between the auxiliary wirings.

4. The display device as set forth in claim 3, comprising:

said driving circuit side substrate includes a plurality of driving circuits provided in parallel;

said plurality of connection wirings are divided into groups in such a manner that a plurality of connection wirings which are provided adjacent to one another belong to each group; and each of said plurality of driving circuits is electrically connected to said connection wirings and said auxiliary wiring belonging to each group.

5. The display device as set forth in claim 3, further comprising:

a connection wiring correction-use auxiliary wiring for correcting disconnection of a connection wiring formed on said display panel side substrate; and said connection wiring correction-use auxiliary substrate is connected to said substrate connection part correction-use auxiliary wiring.

6. The display device as set forth in claim 5, wherein:

said connection wiring correction-use auxiliary wiring is connected to said substrate connection part correction-use auxiliary wiring via at least one driving circuit side substrate, said connection wiring correction-use auxiliary wiring extending from said auxiliary wirings formed on said driving circuit side substrate, which constitute said substrate connection part correction-use auxiliary wiring.

7. The display device as set forth in claim 5, wherein:

said connection wiring correction-use auxiliary wiring extends from said auxiliary wiring formed on said driving circuit-side substrate via at least an area where said connection wiring correction-use auxiliary wiring does not cross said plurality of connection wirings formed on at least one driving circuit side substrate.

8. The display device as set forth in claim 3, further comprising:

a connection wiring correction-use auxiliary wiring, wherein said plurality of connection wirings formed on said display panel side substrate extend to a connection wiring extended part provided outside said display area; and said connection wiring correction-use auxiliary wiring is electrically connected not only to said connection wirings formed on said display panel side substrate in the connection wiring extended part, but also to said substrate connection part correction-use auxiliary wiring.

9. The display device as set forth in claim 8, wherein:

said connection wiring correction-use auxiliary wiring is connected to said substrate connection part correction-use auxiliary wiring via at least one driving circuit side substrate, said connection wiring correction-use auxiliary wiring extending from said auxiliary wirings formed on said driving circuit side substrate, which constitute said substrate connection part correction-use auxiliary wiring.

10. The display device as set forth in claim 8, wherein:

said connection wiring correction-use auxiliary wiring extends from said auxiliary wiring formed on said driving circuit-side substrate via at least an area where said connection wiring correction-use auxiliary wiring does not cross said plurality of connection wirings formed on at least one driving circuit side substrate.

11. The display device as set forth in claim 3, wherein:

said substrate connection part correction-use auxiliary wiring is formed in such a manner that said auxiliary wiring formed on said display panel side substrate and said auxiliary wiring formed on said driving circuit side substrate are connected so as to pass on both sides of said plurality of connection wirings in an alignment direction crossing these auxiliary wirings.

12. The display device as set forth in claim 3, wherein:

said substrate connection part correction-use auxiliary wiring is formed in such a manner that each of said auxiliary wirings formed on said display panel side substrate and said driving circuit side substrate is formed thicker than each of said plurality of connection wirings crossing these auxiliary wirings.

13. A display device which comprises a display panel side substrate provided with a display area and a driving circuit side substrate provided with a driving circuit, in which a plurality of connection wirings formed on said display panel side substrate and a plurality of connection wirings formed on said driving circuit side substrate are electrically connected in a substrate connection part provided outside said display area, wherein:

each of said display panel side substrate and said driving circuit side substrate comprises at least one auxiliary wiring formed so as to cross said plurality of connection wirings formed on each of said display panel side substrate and said driving circuit side substrate via an insulating film, wherein the auxiliary wirings on the two substrates are electrically connected to each other; and wherein the auxiliary wiring and the connection wiring on each of the substrates overlap each other on the second wiring substrate so as to facilitate an electrical connection between one of the connection wirings and both of the auxiliary wirings upon detection of a defect in the one connection wiring in an area outside of a display area and between the auxiliary wirings.

14. The display device as set forth in claim 13, comprising:

said driving circuit side substrate includes a plurality of driving circuits provided in parallel;

said plurality of connection wirings are divided into groups in such a manner that a plurality of connection wirings which are provided adjacent to one another belong to each group; and each of said plurality of driving circuits is electrically connected to said connection wirings and said auxiliary wiring belonging to each group.

15. The display device as set forth in claim 13, further comprising:

a connection wiring correction-use auxiliary wiring for correcting disconnection of a connection wiring formed on said display panel side substrate; and said connection wiring correction-use auxiliary substrate is connected to said substrate connection part correction-use auxiliary wiring.

16. The display device as set forth in claim 15, wherein:

said connection wiring correction-use auxiliary wiring is connected to said substrate connection part correction-use auxiliary wiring via at least one driving circuit side substrate, said connection wiring correction-use auxiliary wiring extending from said auxiliary wirings formed on said driving circuit side substrate, which constitute said substrate connection part correction-use auxiliary wiring.

17. The display device as set forth in claim 15, wherein:

said connection wiring correction-use auxiliary wiring extends from said auxiliary wiring formed on said driving circuit-side substrate via at least an area where said connection wiring correction-use auxiliary wiring does not cross said plurality of connection wirings formed on at least one driving circuit side substrate.

18. The display device as set forth in claim 13, further comprising:

a connection wiring correction-use auxiliary wiring, wherein said plurality of connection wirings formed on said display panel side substrate extend to a connection wiring extended part provided outside said display area; and said connection wiring correction-use auxiliary wiring is electrically connected not only to said connection wirings formed on said display panel side substrate in the connection wiring extended part, but also to said substrate connection part correction-use auxiliary wiring.

19. The display device as set forth in claim 18, wherein:

said connection wiring correction-use auxiliary wiring is connected to said substrate connection part correction-use auxiliary wiring via at least one driving circuit side substrate, said connection wiring correction-use auxiliary wiring extending from said auxiliary wirings formed on said driving circuit side substrate, which constitute said substrate connection part correction-use auxiliary wiring.

20. The display device as set forth in claim 18, wherein:

said connection wiring correction-use auxiliary wiring extends from said auxiliary wiring formed on said driving circuit-side substrate via at least an area where said connection wiring correction-use auxiliary wiring does not cross said plurality of connection wirings formed on at least one driving circuit side substrate.

21. The display device as set forth in claim 13, wherein:

said substrate connection part correction-use auxiliary wiring is formed in such a manner that said auxiliary wiring formed on said display panel side substrate and said auxiliary wiring formed on said driving circuit side substrate are connected so as to pass on both sides of said plurality of connection wirings in an alignment direction crossing these auxiliary wirings.

22. The display device as set forth in claim 13, wherein:

said substrate connection part correction-use auxiliary wiring is formed in such a manner that each of said auxiliary wirings formed on said display panel side substrate and said driving circuit side substrate is formed thicker than each of said plurality of connection wirings crossing these auxiliary wirings.

* * * * *